(12) United States Patent
Heo et al.

(10) Patent No.: US 8,759,183 B2
(45) Date of Patent: Jun. 24, 2014

(54) METHODS OF FORMING SEMICONDUCTOR DEVICES USING ELECTROLYZED SULFURIC ACID (ESA)

(75) Inventors: Jung Shik Heo, Seoul (KR); Naein Lee, Seoul (KR); Soonmoon Jung, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/600,432

(22) Filed: Aug. 31, 2012

(65) Prior Publication Data
US 2013/0171793 A1  Jul. 4, 2013

(30) Foreign Application Priority Data
Jan. 3, 2012  (KR) .................. 10-2012-0000586

(51) Int. Cl.
*H01L 21/336* (2006.01)

(52) U.S. Cl.
USPC ..... 438/294; 438/299; 438/664; 254/E21.409

(58) Field of Classification Search
CPC ............................................ H01L 21/823481
See application file for complete search history.

(56) References Cited

U.S. PATENT DOCUMENTS

| 6,332,970 | B1 | 12/2001 | Coffey |
| 6,495,024 | B1 | 12/2002 | Lindroos et al. |
| 2003/0146191 | A1 | 8/2003 | Tong et al. |
| 2005/0139233 | A1 | 6/2005 | Lee et al. |
| 2010/0178763 | A1* | 7/2010 | Narita et al. .................. 438/664 |
| 2011/0073490 | A1 | 3/2011 | Hayamizu et al. |
| 2011/0143549 | A1 | 6/2011 | Tange et al. |
| 2011/0298055 | A1* | 12/2011 | Nakajima et al. ............. 257/369 |
| 2013/0193514 | A1* | 8/2013 | Loubet et al. ................. 257/347 |

FOREIGN PATENT DOCUMENTS

| JP | 08-291351 | 11/1996 |
| JP | 2001-010817 | 1/2001 |
| JP | 2007-266497 | 10/2007 |
| KR | 1020100056271 | 5/2010 |
| KR | 1020110001583 | 1/2011 |

* cited by examiner

*Primary Examiner* — Mamadou Diallo
(74) *Attorney, Agent, or Firm* — Myers Bigel Sibley & Sajovec, P.A.

(57) ABSTRACT

A method of forming a semiconductor device may include forming a metal layer on a silicon portion of a substrate, and reacting the metal layer with the silicon portion to form a metal silicide. After reacting the metal layer, unreacted residue of the metal layer may be removed using an electrolyzed sulfuric acid solution. More particularly, a volume of sulfuric acid in the electrolyzed sulfuric acid solution may be in the range of about 70% to about 95% of the total volume of the electrolyzed sulfuric acid solution, a concentration of oxidant in the electrolyzed acid solution may be in the range of about 7 g/L to about 25 g/L, and a temperature of the electrolyzed sulfuric acid solution may be in the range of about 130 degrees C. to about 180 degrees C.

53 Claims, 33 Drawing Sheets

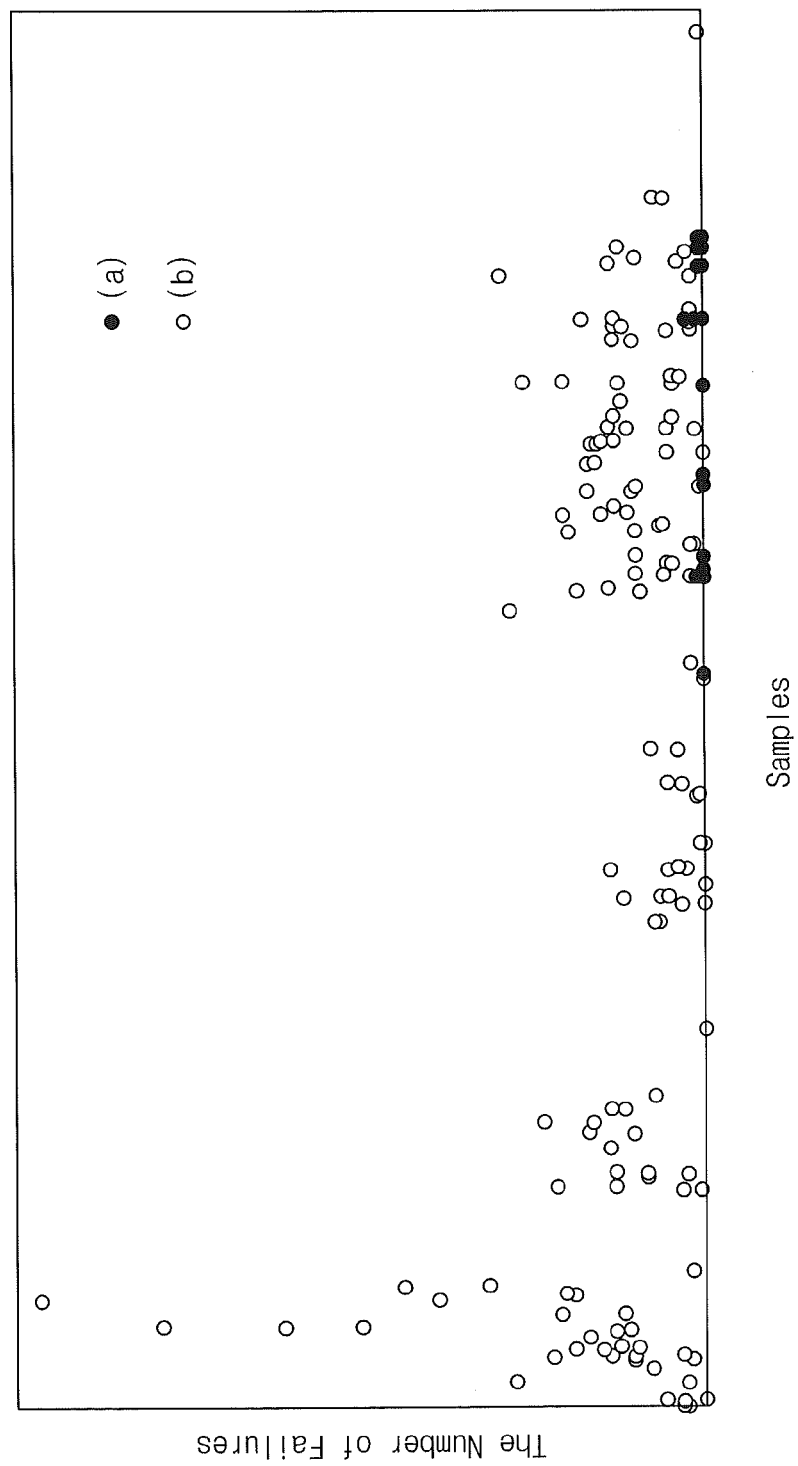

METHODS OF FORMING SEMICONDUCTOR DEVICES USING ELECTROLYZED SULFURIC ACID (ESA)

CROSS-REFERENCE TO RELATED APPLICATION

This U.S. non-provisional patent application claims priority under 35 U.S.C. §119 to Korean Patent Application No. 10-2012-0000586, filed on Jan. 3, 2012, in the Korean Intellectual Property Office, the disclosure of which is hereby incorporated herein in its entirety by reference.

BACKGROUND

Embodiments of inventive concepts relate to semiconductor devices and methods of fabricating the same, and more particularly, to semiconductor devices having metal gates and methods of fabricating the same.

A field effect transistor (hereinafter, referred as to "transistor") is a significant element of semiconductor device. In general, a transistor has source and drain regions, which are formed spaced apart from each other in a semiconductor substrate, and a gate electrode covering a channel region between the source and drain regions. The source and drain regions may be formed by implanting dopants into the semiconductor substrate. The gate electrode may be electrically separated from the channel region by a gate insulating layer between the semiconductor substrate and the gate electrode. In semiconductor devices, transistors are widely used as switching devices and/or elements of logic circuits.

Operating speeds of semiconductor devices are increasing. Sizes of transistors are decreasing, increasing integration densities of semiconductor devices, and this may lead to reductions in turn-on currents of transistors, which may reduce transistor speeds. In addition, the reduction in sizes of transistors may lead to increases in contact resistances between source or drain regions and contact-plug structures, which may be another factor reducing transistor speeds. Owing to these factors, it may be increasingly difficult to satisfy increasing demands for fast operating speeds of semiconductor devices. To increase speeds of transistors, gate electrodes may be formed to have reduced resistance. For example, gate electrodes may be formed to include metal layers of reduced resistivity.

SUMMARY

Some embodiments of inventive concepts may provide highly reliable semiconductor devices with metal gates.

Other embodiments of inventive concepts may provide methods of fabricating highly reliable semiconductor devices with metal gates.

According to example embodiments of inventive concepts, a method of fabricating a semiconductor device may include forming a gate insulating layer on a silicon substrate, forming a gate including a metal nitride layer on the gate insulating layer, forming source and drain regions in the silicon substrate at opposite sides of the gate, forming a sidewall spacer on a sidewall of the gate, and forming a metal silicide layer on the source and drain regions. Forming the metal silicide layer may include providing nickel on the source and drain regions, performing a thermal treatment to react the nickel with silicon, and using an electrolyzed sulfuric acid solution to remove an unreacted residue of the nickel.

In example embodiments, the sidewall spacer may be formed to expose at least a portion of the metal nitride layer, and the exposed metal nitride layer may be substantially etch-resistant with respect to the electrolyzed sulfuric acid.

In example embodiments, the method may further include forming an interlayered insulating layer to cover the gate and the metal silicide layer, etching the interlayered insulating layer to form an opening exposing the metal silicide layer, and using the electrolyzed sulfuric acid to clean a residue from the opening.

In example embodiments, a preparation of the electrolyzed sulfuric acid may include a hydrogen separating process.

In example embodiments, the electrolyzed sulfuric acid may be prepared using a sulfuric acid solution, in which hydrogen peroxide is not substantially included.

According to example embodiments of inventive concepts, a method of fabricating a semiconductor device may include forming a gate insulating layer and a gate on a silicon substrate, forming an interlayered insulating layer to cover the gate, patterning the interlayered insulating layer to form a first opening exposing the silicon substrate, the first opening being formed at one or more sides of the gate, and forming a metal silicide layer in the first opening. Forming of the metal silicide layer may include providing a first metal layer in the first opening, performing a thermal treatment to react the first metal layer and silicon, and using an electrolyzed sulfuric acid to remove an unreacted residue of the first metal layer.

In example embodiments, forming of the gate may include forming a mold insulating layer on the silicon substrate having a gate trench therein, and forming the gate in the gate trench. The gate may include a metal nitride layer and a second metal layer, which may be stacked sequentially.

In example embodiments, the gate may include a metal nitride layer and a polysilicon layer on the metal nitride layer, and the first metal layer may include nickel.

According to example embodiments of inventive concepts, a method of fabricating a semiconductor device may include forming a device isolation layer in a silicon substrate including an NMOS region and a PMOS region to define an active region, forming a gate insulating layer on the active region, forming a gate including a first metal layer on the gate insulating layer, forming a sidewall spacer on a sidewall of the gate, and forming a metal silicide layer on the active region at opposite sides of the gate. Forming of the metal silicide layer may include providing a second metal layer on the active region, performing a thermal treatment to react the second metal layer with silicon, and using an electrolyzed sulfuric acid to remove an unreacted residue of the second metal layer while the first metal layer is substantially etch-resistant to the electrolyzed sulfuric acid.

In example embodiments, the first metal layer may include at least one of tungsten, molybdenum, titanium nitride, tungsten nitride, and/or tantalum nitride.

In example embodiments, the second metal layer may include nickel.

In example embodiments, the method may further include forming a mask pattern to expose at least a portion of the active region of the PMOS region, and forming a germanium containing layer on the exposed active region. Exposing the active region may include recessing a portion of an edge of the device isolation layer adjacent to the exposed active region to form a first dent. A portion of the first metal layer may extend toward the first dent, and the sidewall spacer may be formed to expose a portion of the first metal layer on the first dent. In addition, the method may further include recessing another portion of the edge of the device isolation layer adjacent to the active region of the NMOS region to form a second dent. A depth of the first dent may be greater than that of the second dent.

In example embodiments, the method may further include recessing a portion of an edge of the device isolation layer adjacent to the active region to form a dent. A portion of the first metal layer may extend toward the dent, and the sidewall spacer may be formed to expose a portion of the first metal layer on the dent.

According to example embodiments of inventive concepts, a method of fabricating a semiconductor device may include forming a gate insulating layer on an active region of a silicon substrate, forming a gate including a first metal on the gate insulating layer, forming a sidewall spacer on a sidewall of the gate, and forming a metal silicide layer on the active region at opposite sides of the gate. Forming the metal silicide layer may include providing a second metal on the active region, performing a thermal treatment to react the second metal with silicon, and removing an unreacted residue of the second metal using a solution, in which the second metal has an etch rate greater than or equivalent to the first metal.

According to example embodiments of inventive concepts, a method of fabricating a semiconductor device may include forming a gate insulating layer on an active region of a silicon substrate, forming a gate including a first metal on the gate insulating layer, forming a sidewall spacer on a sidewall of the gate, and forming a metal silicide layer on the active region at opposite sides of the gate. Forming of the metal silicide layer may include providing a second metal on the active region, performing a first thermal treatment to react the second metal with silicon, using an electrolyzed sulfuric acid to remove an unreacted residue of the second metal after the first thermal treatment, and performing a second thermal treatment at a temperature higher than that of the first thermal treatment.

In example embodiments, the method may further include using electrolyzed sulfuric acid or aqua regia to further remove unreacted residue of the second metal after the second thermal treatment.

According to example embodiments of inventive concepts, a semiconductor device may include a silicon substrate having a PMOS region and an NMOS region and having an active region defined by a device isolation layer, a gate insulating layer on the active region, a gate including a metal layer on the gate insulating layer, source and drain regions provided in the active region at opposite sides of the gate, a sidewall spacer on a sidewall of the gate, and a metal silicide layer on the source and drain regions. The metal layer may extend toward a dent formed at an edge of the device isolation layer adjacent to the active region, and the sidewall spacer may have a thickness exposing a portion of the metal layer on the dent.

In example embodiments, an upper portion of the active region in the PMOS region may include a silicon germanium layer, and the dent of the PMOS region may be deeper than the dent of the NMOS region.

In example embodiments, in the PMOS region, an upper surface of the dent may be lower than a bottom surface of the silicon germanium layer.

According to some examples of inventive concepts, a method of forming a semiconductor device may include forming first and second active regions in a silicon substrate wherein the first and second active regions have opposite conductivity types, and wherein the first and second active regions are surrounded by a device isolation layer. A first gate may be formed on the first active region, with the first gate including a first gate insulating layer on the first active region and a first gate electrode on the first gate insulating layer. A second gate may be formed on the second active region, with the second gate including a second gate insulating layer on the second active region and a second gate electrode on the second gate insulating layer. First source/drain regions may be formed in the first active region on opposite sides of the first gate, and second source/drain regions may be formed in the second active region on opposite sides of the second gate. A metal layer may be formed on at least one of the first source/drain regions and on at least one of the second source/drain regions. The metal layer may be reacted with the at least one of the first source/drain regions and with the at least one of the second source/drain regions to form a metal silicide on the at least one of the first source/drain regions and on the at least one of the second source/drain regions. After reacting the metal layer, unreacted residue of the metal layer may be removed using an electrolyzed sulfuric acid solution.

According to some other examples of inventive concepts, a method of forming a semiconductor device may include forming a gate on a silicon substrate, with the gate including a gate insulating layer on the silicon substrate and a gate electrode on the gate insulating layer, and with the gate electrode including a layer of a first metal on the gate insulating layer. Source/drain regions may be formed in the silicon substrate on opposite sides of the gate, and a second metal layer may be formed on at least one of the source/drain regions, with the first and second metal layers comprising different metals. The second metal layer may be reacted with the at least one of the source/drain regions to form a metal silicide on the at least one of the source/drain regions. After reacting the metal layer, unreacted residue of the second metal layer may be removed using an etching solution wherein an etch rate of the second metal layer with respect to the etching solution is significantly greater than an etch rate of the first metal layer with respect to the etching solution.

According to some more examples of inventive concepts, a method of forming a semiconductor device may include forming a gate on a substrate, with the gate including a high-k dielectric layer on the substrate and a metal gate electrode on the high-k dielectric layer. Source/drain regions may be formed on the substrate on opposite sides of the gate, and a metal layer may be formed on at least one of the source/drain regions. The metal layer may be reacted with the at least one of the source/drain regions to form a metal silicide on the at least one of the source/drain regions. After reacting the metal layer, unreacted residue of the metal layer may be removed using electrolyzed sulfuric acid solution.

According to still other examples of inventive concepts, a method of forming a semiconductor device may include forming a gate on a silicon substrate, forming insulating spacers on sidewalls of the gate, and forming source/drain regions in the silicon substrate on opposite sides of the gate. A metal layer may be formed on at least one of the source/drain regions, and a first thermal treatment may be performed to form a metal silicide on the at least one of the source/drain regions. After reacting the metal layer, unreacted residue of the metal layer may be removed using electrolyzed sulfuric acid solution. After removing unreacted residue, a second thermal treatment may be performed at a temperature exceeding a maximum temperature of the first thermal treatment. After performing the second thermal treatment, a surface of the semiconductor device including the metal silicide may be cleaned using aqua regia.

According to yet other examples of inventive concepts, a method of forming a semiconductor device may include forming a metal layer on a silicon portion of a substrate, and reacting the metal layer with the silicon portion to form a metal silicide. After reacting the metal layer, unreacted residue of the metal layer may be removed using electrolyzed sulfuric acid solution. More particularly, a volume of sulfuric acid in the electrolyzed sulfuric acid solution may be in the range of about 70% to about 95% of the total volume of the electrolyzed sulfuric acid solution, a concentration of oxidant in the electrolyzed acid solution may be in the range of about 7 g/L to about 25 g/L, and a temperature of the electrolyzed sulfuric acid solution may be in the range of about 130 degrees C. to about 180 degrees C.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 14 is a graph showing numbers of failures in semiconductor devices formed according to inventive concepts and according to a conventional method;

FIGS. 27A through 41A illustrate operations of fabricating a semiconductor device according to other example embodiments of inventive concepts and are sectional views taken along lines I-I' and II-II' of FIG. 26, respectively;

FIGS. 27B through 41B illustrate operations of FIGS. 27A through 41A according to other example embodiments of inventive concepts and are sectional views taken along lines III-III' and IV-IV' of FIG. 26, respectively;

Figure 1:
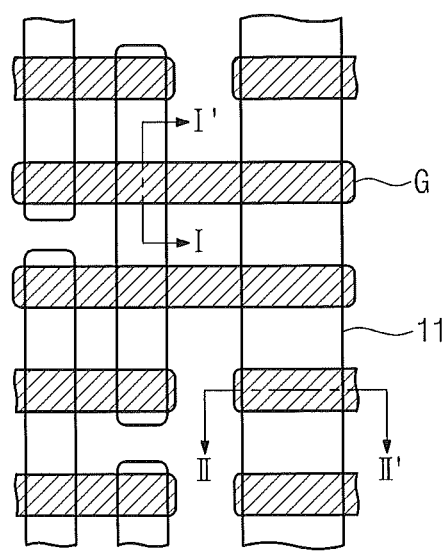
FIG. 1 is a layout illustrating an example of a semiconductor device according to example embodiments of inventive concepts.

It should be noted that these figures are intended to illustrate general characteristics of methods, structures and/or materials used in certain example embodiments and to supplement the written description provided below. These drawings are not, however, to scale and may not precisely reflect the precise structural and/or performance characteristics of any given embodiment, and should not be interpreted as defining or limiting the range of values or properties encompassed by example embodiments. For example, relative thicknesses and/or positionings of molecules, layers, regions and/or structural elements may be reduced and/or exaggerated for clarity. The use of similar or identical reference numbers in the various drawings is intended to indicate the presence of a similar or identical elements or features.

DETAILED DESCRIPTION

Example embodiments of inventive concepts will now be described more fully with reference to the accompanying drawings, in which example embodiments are shown. Example embodiments of inventive concepts may, however, be embodied in many different forms and should not be construed as being limited to the embodiments set forth herein; rather, these embodiments are provided so that this disclosure will be thorough and complete, and will fully convey concepts of example embodiments to those of ordinary skill in the art. In the drawings, the thicknesses of layers and regions are exaggerated for clarity. Like reference numerals in the drawings denote like elements, and thus their repetitive description may be omitted.

It will be understood that when an element or layer is referred to as being "connected" or "coupled" to another element or layer, it can be directly connected or coupled to the other element or layer or intervening elements may be present. In contrast, when an element or layer is referred to as being "directly connected" or "directly coupled" to another element or layer, there are no intervening elements or layers present. Like numbers indicate like elements or layers throughout. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted regions. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. In addition, a phrase "at least one" is used herein to indicate that one or more respective components may be used in any combination.

It will be understood that the term "substantially not contain" herein indicates that the content may be at most very small.

A semiconductor device to be described herein may be a memory device, a non-memory device, and/or a driving device for a memory or non-memory device.

FIG. 1 is a layout illustrating an example of a semiconductor device according to example embodiments of inventive concepts. Referring to FIG. 1, a semiconductor device according to example embodiments of inventive concepts may include an active region 11 formed in a substrate. A gate G may be disposed to cross the active region 11.

Hereinafter, a method of fabricating a semiconductor device according to example embodiments of inventive concepts will be described with reference to FIGS. 2 through 12, which are sectional views taken along lines I-I' and II-II' of FIG. 1.

Figure 2:
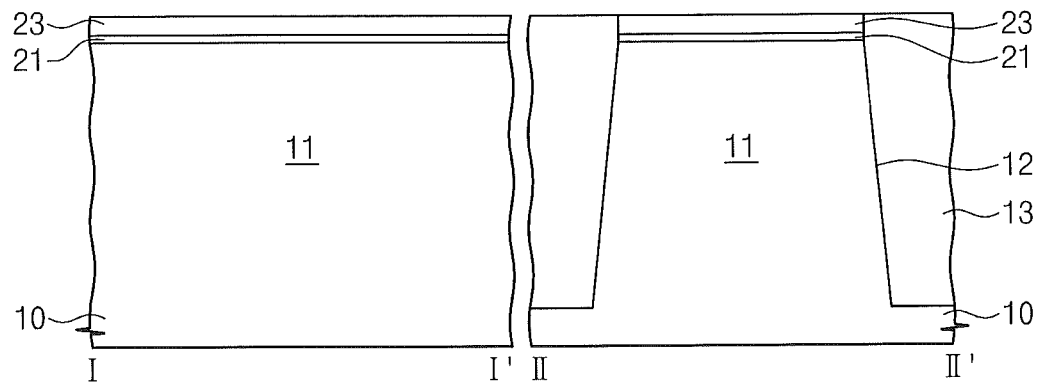
FIGS. 2 through 12 illustrate operations of fabricating a semiconductor device according to example embodiments of inventive concepts and are sectional views taken along lines I-I' and II-II' of FIG. 1.

Referring to FIG. 2, a substrate 10 is provided. The substrate 10 may be a silicon substrate. The substrate 10 may include one selected from the group including a single-crystalline silicon layer, a silicon-on-insulator (SOI) substrate, and/or a silicon germanium (SiGe) substrate. The substrate 10 may be formed to have a first conductivity type (e.g., p-type).

A first mask pattern 23 may be formed on the substrate 10. The first mask pattern 23 may include a silicon nitride layer. The silicon nitride layer may be formed using a CVD method. A buffer oxide layer 21 may be formed between the first mask pattern 23 and the substrate 10. For example, the buffer oxide layer 21 may be a thermal oxidation layer.

The substrate 10 may be etched using the first mask pattern 23 as an etch mask to form a trench 12. The trench 12 may be filled with a device isolation layer 13. The device isolation layer 13 may include a silicon oxide layer. A liner nitride layer may be formed between the trench 12 and the device isolation layer 13. Before the formation of the liner nitride layer, a thermal oxide layer may be formed on an inner wall of the trench 12. The device isolation layer 13 may be planarized to expose the first mask pattern 23 and fill the trench 12. The planarization may be performed using, for example, a chemical mechanical polishing process. The device isolation layer 13 may be formed to define the active region 11. In example embodiments, the active region 11 may be formed to have a top surface, which may be coplanar with or lower than a top surface of the insulating device isolation layer 13. In other embodiments, the active region 11 may have a top surface protruding from the top surface of the device isolation layer 13 to provide a fin-shaped structure.

Figure 3:
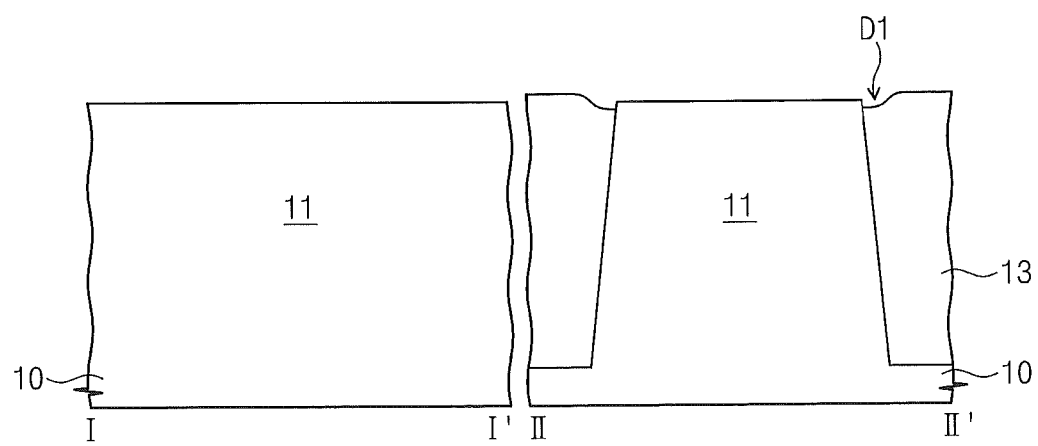

Referring to FIG. 3, the mask pattern 23 and the buffer oxide layer 21 may be removed to expose the active region 11. The removal of the mask pattern 23 and the buffer oxide layer 21 may be performed using a wet etching process. In example embodiments, the device isolation layer 13 may be also etched during the removal of the mask pattern 23 and the buffer oxide layer 21. For example, an edge of the device isolation layer 13 adjacent to the active region 11 may be etched deeper than other portions, such that a first dent D1 may be formed at the edge of the device isolation layer 13. For example, the first dent D1 may have a surface lower than a top surface of the device isolation layer 13. In example embodiments, the first dent D1 may have a surface lower than the top surface of the active region 11.

Figure 4:
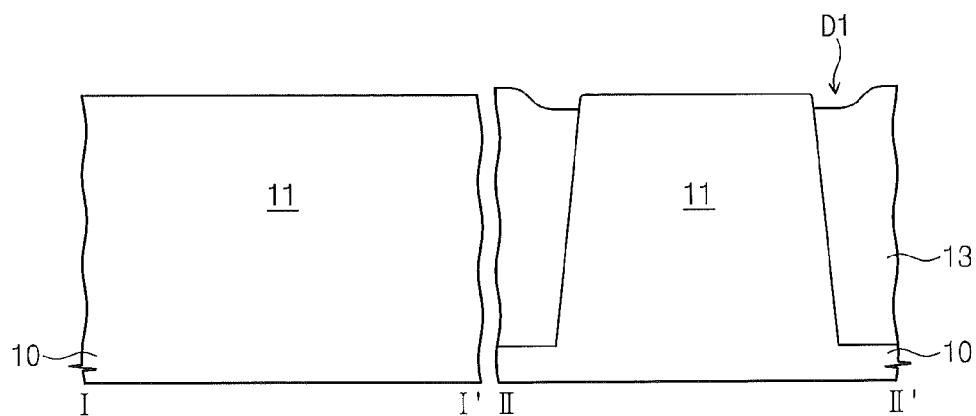

Referring to FIG. 4, a cleaning operation may be performed to remove a natural oxide, which may be unintentionally formed on a surface of the active region. A solution including hydrofluoric acid, for example, may be used for the cleaning process. This may lead to a further recess of the device isolation layer 13, and thus, the surface of the first dent D1 may be further lowered.

Figure 5:
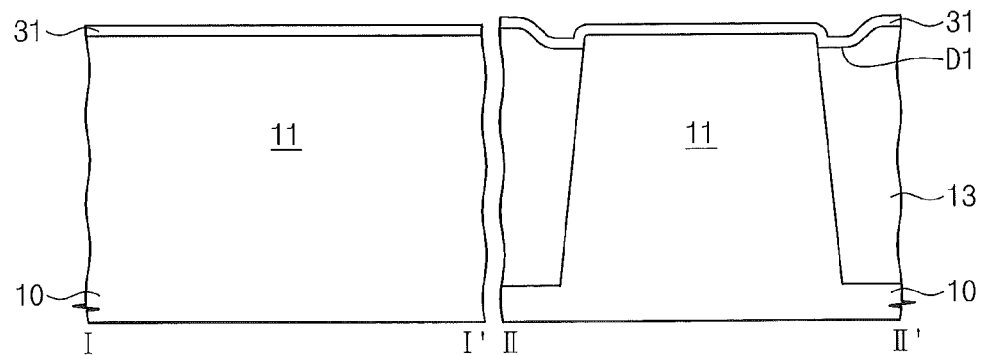

Referring to FIG. 5, a gate insulating layer 31 may be formed. The gate insulating layer 31 may include at least one selected from the group consisting of oxide, nitride, oxynitride, metal silicate, and/or an insulating high-k refractory metal oxide (e.g., hafnium oxide or aluminum oxide). For example, the gate insulating layer 31 may include at least one of a refractory metal oxide layer, a refractory metal silicon oxide layer, and/or a refractory metal silicon oxynitride layer. In example embodiments, the gate insulating layer 31 may include a hafnium oxide layer, a hafnium silicon oxide layer, and/or a hafnium metal silicon oxynitride layer.

Figure 6:
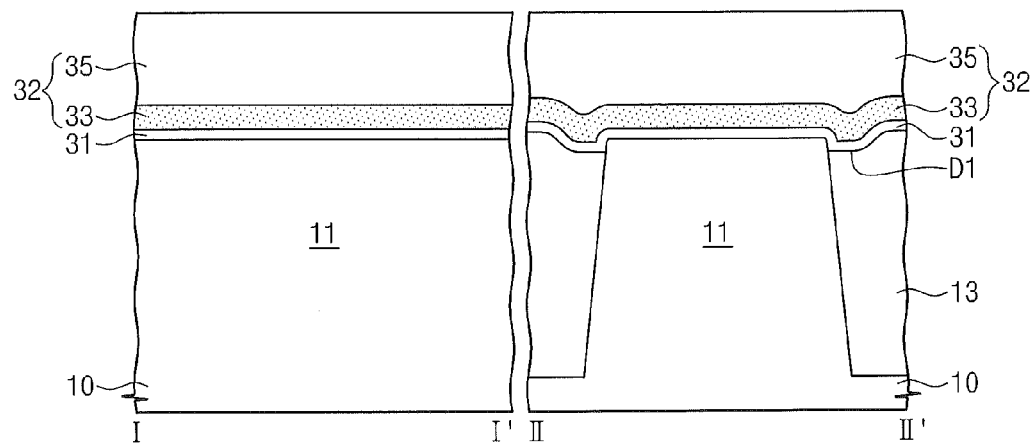

Referring to FIG. 6, a gate layer 32 may be formed on the gate insulating layer 31. The gate layer 32 may include a first metal layer 33. The first metal layer 33 may include, for example, at least one of tungsten, molybdenum, titanium nitride, tungsten nitride, and/or tantalum nitride. The gate layer 32 may further include a polysilicon layer 35 on the first metal layer 33. The polysilicon layer 35 may be doped with impurities. The first metal layer 33 and the polysilicon layer 35 may be formed using a sputtering method. A thickness of the polysilicon layer 35 may be thicker than that of the first metal layer 33.

Figure 7:
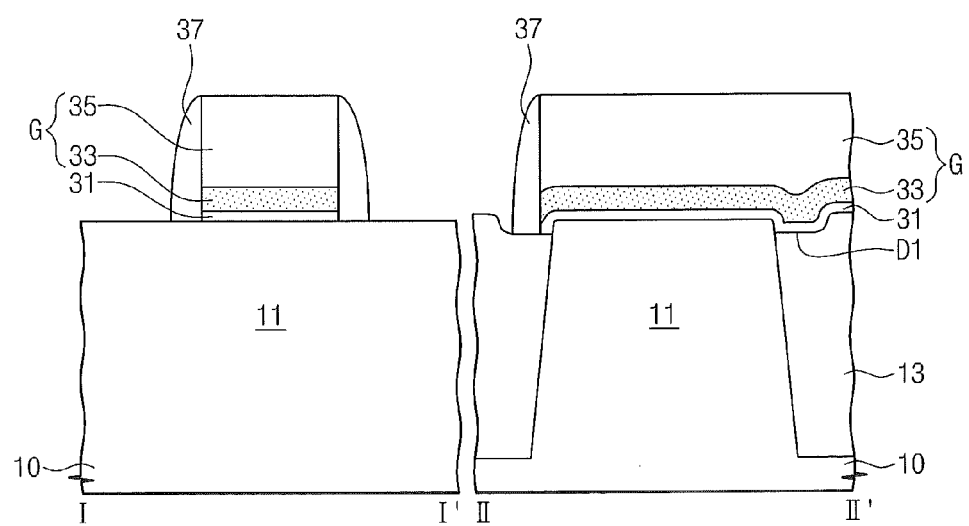

Referring to FIG. 7, the gate layer 32 may be patterned to form the gate G. In example embodiments, the gate G may have a portion disposed on the first dent D1. A sidewall spacer 37 may be formed to cover a sidewall of the gate G. The sidewall spacer 37 may include a silicon oxide layer and/or a silicon nitride layer.

Figure 8:
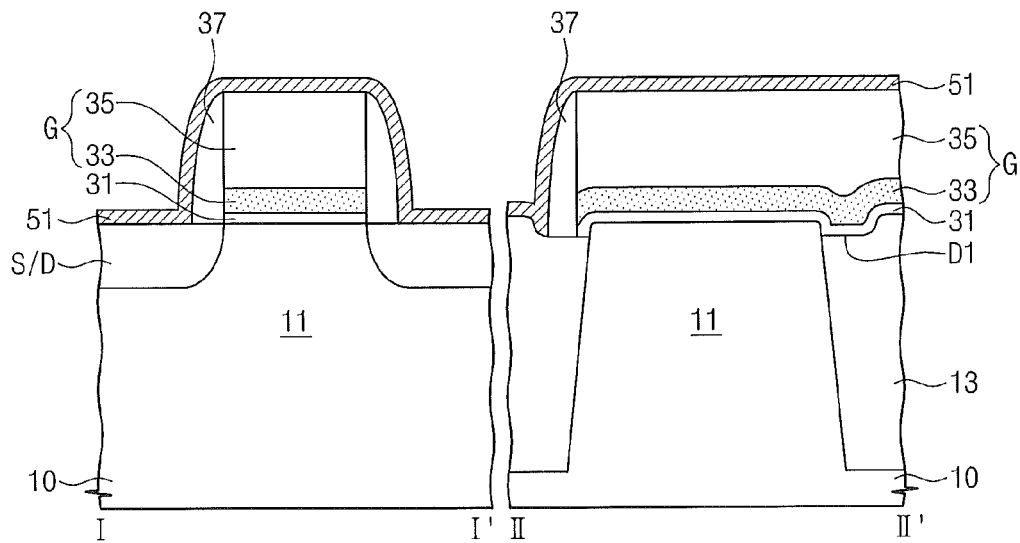

Referring to FIG. 8, the active region 11 may be doped with impurities using the gate as a mask to form source and drain regions S/D. A second metal layer 51 may be provided on the active region 11 and the gate G. The second metal layer 51 may include nickel. The second metal layer 51 may further include platinum in the range of about 1 wt % to about 15 wt %. The second metal layer 51 may have a thickness of several hundred angstroms. In example embodiments, a titanium nitride layer (not shown) may be additionally formed on the second metal layer 51.

Figure 9:
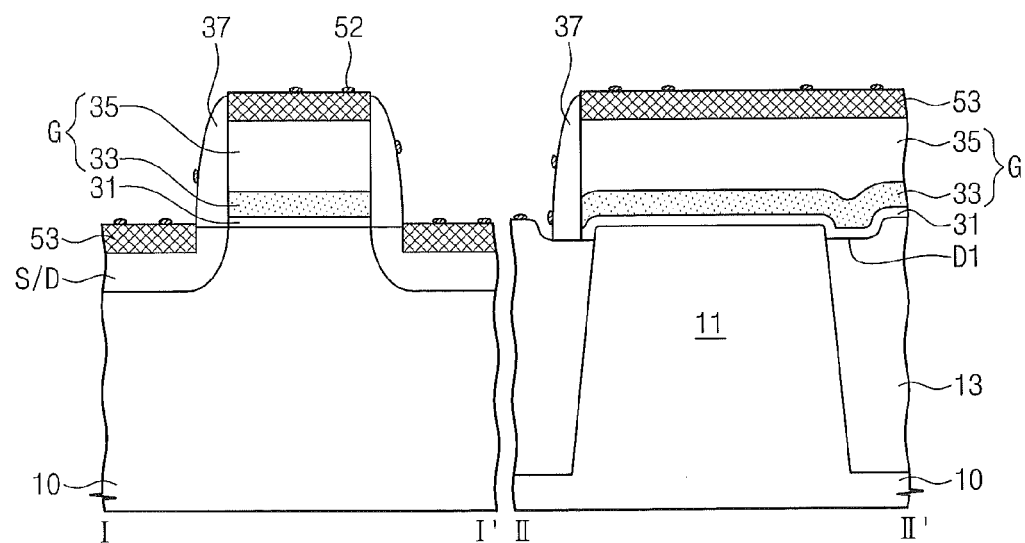

Referring to FIG. 9, the second metal layer 51 may be thermally treated to form a first metal silicide layer 53. The first metal silicide layer 53 may be formed by a reaction between silicon of the substrate 10 and the second metal layer 51 and/or between the polysilicon layer 35 of the gate G and the second metal layer 51. The first metal silicide layer 53 may be formed on the active region 11 positioned at both sides of the gate G as well as on the gate G. The thermal treatment may include a first thermal treatment and a second thermal treatment after the first thermal treatment. The first thermal treatment may be performed at a temperature ranging from about 200° C. to about 350° C. (e.g., at about 260° C. using a rapid thermal anneal or RTA) to form a metal rich silicide phase. The first thermal treatment may be performed in a furnace. In the first thermal treatment, most of the second metal layer 51 may be transformed into the first metal silicide layer 53. However, some portion of the second metal layer 51 may remain in a form of a residue 52, which is unreacted with silicon. Since the unreacted metal residue 52 may result in a failure of the semiconductor device, it should be removed. For example, as in a conventional method, the unreacted metal residue 52 may be removed using an aqua regia (AR) including nitric acid and hydrochloric acid (e.g., including $HNO_3$ and HCL at a ratio of about 1:3, at about 50° C. for 15 minutes). However, the first metal silicide layer 53 may be damaged by the use of the aqua regia, because the first metal silicide layer 53 is formed by the first thermal treatment performed at a low temperature. In other words, the aqua regia cannot be used for the afore-described object provided with the first metal silicide layer 53 formed by the first thermal treatment. According to example embodiments of inventive concepts, an electrolyzed sulfuric acid (ESA) solution may be used (e.g., at about 150° C. for about 100 seconds) to remove unreacted metal residue 52, after the first thermal treatment.

The second thermal treatment may be performed at a temperature higher than the first thermal treatment after etching using the ESA solution. For example, the second thermal treatment may be performed at a temperature of about 400° C. or higher (e.g., at about 800° C. using a rapid thermal anneal or RTA) to form a monosilicide phase. More particularly, the second thermal treatment may include a soak anneal in the range of 400° C. to 500° C. followed by a laser anneal in the range of about 700° C. to about 1000° C. As the result of the second thermal treatment, the first metal silicide layer 53 may be transformed into a mono silicide layer. In example embodiments, the second thermal treatment may be performed using a laser thermal treatment and a halogen-lamp thermal treatment.

Figure 10:
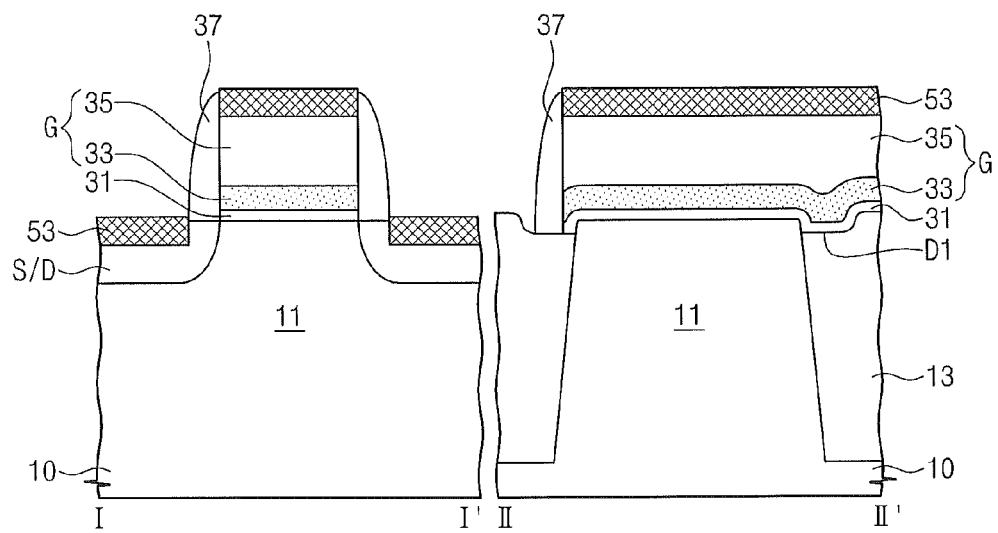

Referring to FIG. 10, after the second thermal treatment, remaining unreacted metal residue 52 may be removed. In example embodiments, remaining unreacted metal residue 52 may be removed using electrolyzed sulfuric acid ESA and/or aqua regia AR (with the AR including $HNO_3$ and HCL at a ratio of about 1:3, at about 50° C. for 15 minutes). For example, an AR strip may be followed by a SiN dry etch and then an ESA strip (e.g., for about 80 seconds at about 150° C.). In addition, an SC1 (e.g., a standard clean including $NH_4OH$, $H_2O_2$, and dionized water) strips may be performed after the AR and/or ESA strips for particle removal.

It will be described how to prepare the electrolyzed sulfuric acid. Referring to the reaction equation 1, the electrolysis may be performed using a sulfuric acid solution, in which sulfuric acid and water are mixed.

$$H_2SO_4 = 2H^+ + SO_4^{2-}$$ [Reaction Equation 1]

The sulfate ion $SO_4^{2-}$ (which is produced from the electrolysis) may be used in the etching process. In example embodiments, the electrolyzed sulfuric acid may be understood to contain the sulfate ion $SO_4^{2-}$. During the electrolysis, ionized hydrogen (e.g., $H^+$) produced from the electrolysis may be converted into hydrogen ($H_2$) and then may be separated from the electrolyzed sulfuric acid. The sulfuric acid solution may be substantially free of hydrogen peroxide. The sulfuric acid solution may have a temperature ranging from about 130° C. to about 180° C., and more particularly, about 150° C. Moreover, a volume of sulfuric acid in the electrolyzed sulfuric acid solution may be in the range of about 70% to about 95% of the total volume of the electrolyzed sulfuric acid solution, and a concentration of oxidant in the electrolyzed sulfuric acid solution may be in the range of about 7 g/L to about 25 g/L. Accordingly, an etch rate of the electrolyzed sulfuric acid on a metallic element (e.g., nickel) for the first metal silicide layer may be equivalent to or lower than that on a metallic element (e.g., tungsten, molybdenum, titanium nitride, tungsten nitride or tantalum nitride) used for the gate. Using the electrolyzed sulfuric acid, hafnium oxide, hafnium silicon oxide, or hafnium metal silicon oxynitride may have an extremely/relatively low etch rate, compared with an etch rate of the metallic element (e.g., nickel) for the first metal silicide layer.

By contrast, as shown in the reaction equation 2, a sulfuric acid containing solution (hereinafter, referred as to SPM) may be conventionally prepared using hydrogen peroxide and sulfuric acid.

$$H_2SO_4 + H_2O_2 = 2H^+ + SO_5^{2-} + H_2O$$

$$H_2O_2 = H^+ + HO_2^-$$ [Reaction Equation 2]

The SPM mainly includes peroxymonosulfuric acid. The SPM may further include ionized hydrogen ($H^+$) and hydroperoxyl ($HO_2^-$). The ionized hydrogen (H+) and the hydroperoxyl ($HO_2^-$) can strongly etch a metal layer such as metal nitride (e.g., of titanium nitride). An etch rate of the metal in the gate G is much higher in the use of the SPM than in the use of the electrolyzed sulfuric acid. For example, an etch rate of a titanium nitride layer may be 100 or more times higher when using SPM than when using electrolyzed sulfuric acid. Accordingly, in the case in which the gate is formed to include a metal layer, unreacted metal residue may be selectively removed by using the electrolyzed sulfuric acid, rather than by using the SPM.

The unreacted metal residue may be removed using other etching solutions instead of the electrolyzed sulfuric acid. The metal layer provided for the gate G may be desirably maintained on the active regions during/after removing the unreacted metal residue. In other words, an etch rate of a metal layer provided for the gate G may be significantly lower than an etch rate of a metal layer provided for the metal silicide layer. According to example embodiments of inventive concepts, a metal layer provided for the gate G may be configured to exhibit an etch rate equivalent to or smaller than an etch rate of a metal layer provided for the metal silicide layer, using an etching solution provided to remove the unreacted metal residue.

Figure 11:
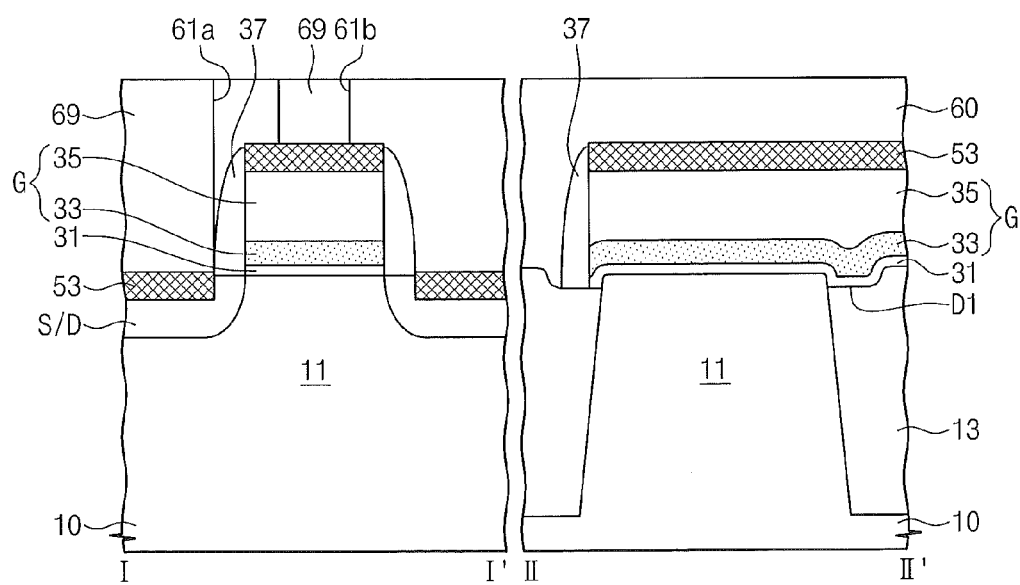

Referring to FIG. 11, an interlayered insulating layer 60 may be formed to cover the gate G and the first metal silicide layer 53. The interlayered insulating layer 60 may be a silicon oxide layer. The interlayered insulating layer 60 may be patterned to form first openings 61A and 61B exposing top surfaces of the first metal silicide layer 53 and the gate G.

A residue may be removed from the openings using the electrolyzed sulfuric acid. Contact plugs 69 may be formed in the openings 61A and 61B. In example embodiments, the contact plug 69 may be formed of tungsten.

Figure 12:
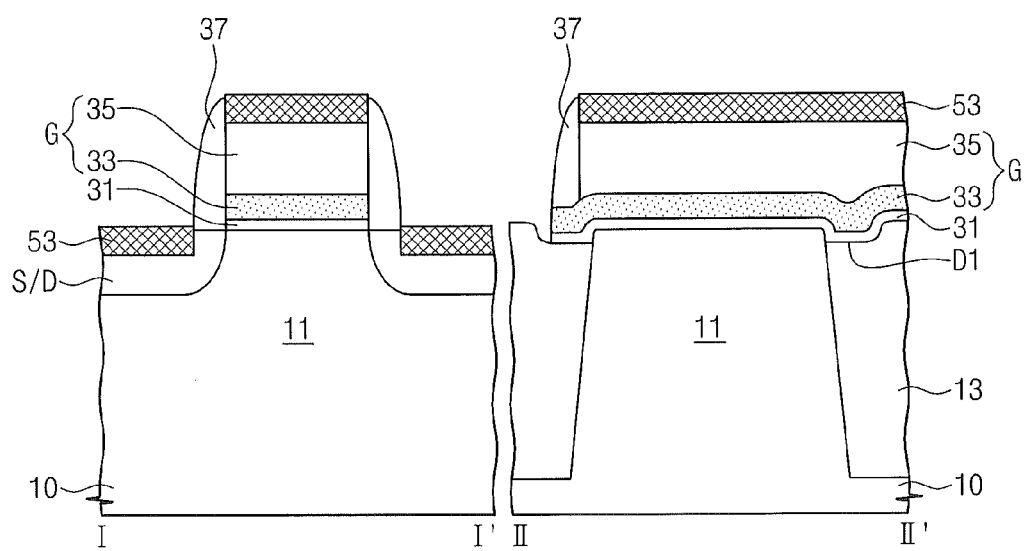

Referring to FIG. 12 (as an alternative to the structure of FIG. 10), the first metal layer 33 may be formed to have a portion, whose width is greater than that of the polysilicon layer 35. For example, on the device isolation layer in FIG. 12 (especially, on the first dent D1), the first metal layer 33 may protrude laterally from a sidewall of the polysilicon layer 35. In FIG. 12, the first metal layer 33 and the polysilicon layer 35 may be etched/patterned separately. In contrast, the polysilicon layer 35 and the first metal layer 33 in FIG. 10 may be successively etched in the same operation. In the case in which a thickness of the first metal layer 33 increases on the first dent D1, a remaining amount of the first metal layer 33 may increase on the first dent D1. Furthermore, in the case in which a width of the gate G and a thickness of the sidewall spacer 37 are reduced to increase an integration density of the semiconductor device, the sidewall spacer 37 may be formed to partially expose the first metal layer 33 on the first dent D1. In example embodiments, the sidewall spacer 37 may be thin enough to expose at least a portion of the first metal layer 33.

Even if the first metal layer 33 is not wholly covered with the sidewall spacer layer 37 and is exposed by the electrolyzed sulfuric acid, the first metal layer 33 may not be significantly etched and may remain. In contrast, the conventional SPM is effective in removing the unreacted metal residue, but can unintentionally remove the first metal layer 33. In other words, if the unreacted metal residue is removed using the electrolyzed sulfuric acid, it may be possible to prevent/reduce removal of the metal layer of the gate G thereby reducing failures of the semiconductor device.

Figure 13A:
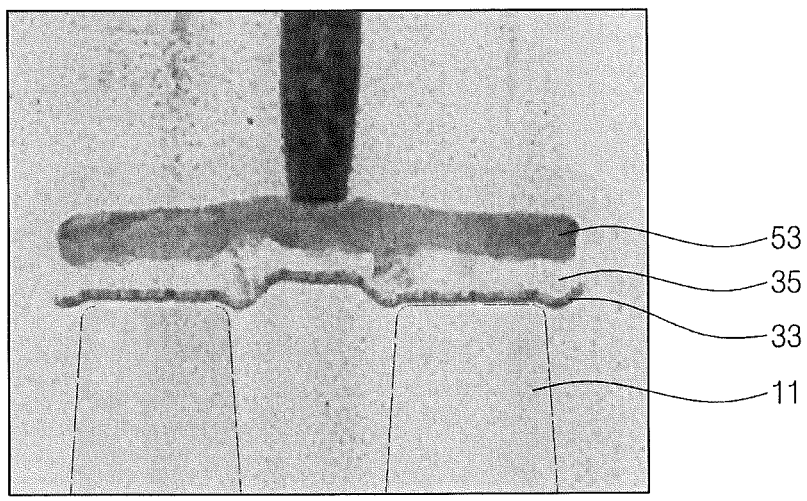
FIG. 13A is a TEM image of a transistor according to example embodiments of inventive concepts.
Figure 13B:
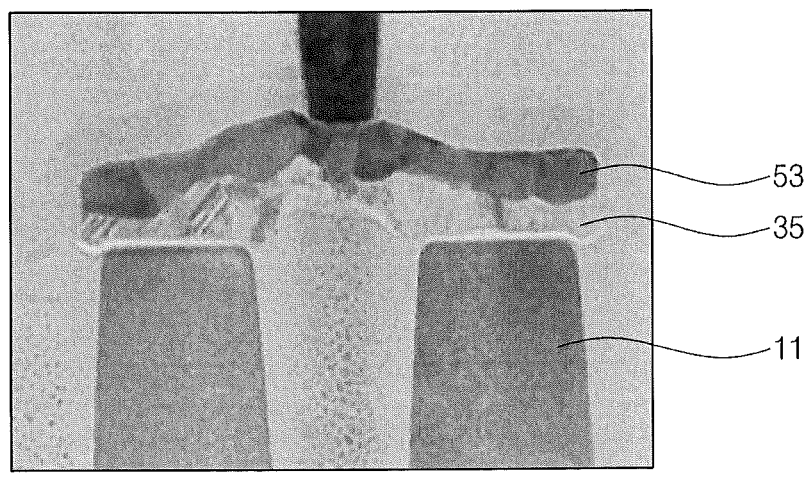
FIG. 13B is a TEM image of a transistor formed using a conventional method.

FIG. 13A is a TEM image of a transistor according to example embodiments of inventive concepts, and FIG. 13B is a TEM image of a transistor formed using a conventional method. In detail, FIG. 13A was obtained from a gate formed using electrolyzed sulfuric acid according to example embodiments of inventive concepts, and FIG. 13B was obtained from a gate formed using SPM according to a conventional method. In the experiments, the gate insulating layer was formed of hafnium silicon oxide, and the first metal layer was formed of titanium nitride. As shown, the titanium nitride of the gate remained when using the electrolyzed sulfuric acid, while it was removed when using the conventional SPM. The removal of the titanium nitride can lead to an operational failure of a transistor.

FIG. 14 is a graph showing numbers of failures in semiconductor devices which were fabricated using the electrolyzed sulfuric acid according to inventive concepts and using the conventional SPM. As shown, use of electrolyzed sulfuric acid, labeled by (a), caused a reduction in numbers of failures, by 97%, compared with the use of SPM labeled by (b).

Semiconductor devices according to example embodiments of inventive concepts will be described with reference to FIGS. 10 and 12.

Semiconductor devices according to example embodiments of inventive concepts may include the gate G provided on the substrate 10 with the gate insulating layer 31 interposed therebetween, the source and drain regions S/D disposed at both opposite sides of the gate G, and the sidewall spacers 37 disposed on a sidewall of the gate G.

The substrate 10 may include one selected from the group including a single-crystalline silicon layer, a silicon-on-insulator (SOI) substrate, or a silicon germanium (SiGe) substrate. The substrate 10 may be formed to have a first conductivity type (e.g., p-type). The device isolation layer 13 may be provided on the substrate 10 to define the active region 11.

The device isolation layer 13 may be a shallow trench isolation (STI) layer. The device isolation layer 13 may have the first dent D1 adjacent to the active region 11. The first dent D1 may be a recessed portion of the edge of the device isolation layer 13. In example embodiments, a surface of the first dent D1 is lower than a top surface of the active region 11.

The gate G is provided on the active region 11 to extend toward a top surface of the device isolation layer 13. The gate G may include the first metal layer 33 and the polysilicon layer 35, which are sequentially stacked on the active region 11. The first metal layer 33 may include a metal layer (e.g., of tungsten or molybdenum) or a conductive metal nitride layer (e.g., of titanium nitride, tungsten nitride, and/or tantalum nitride).

The gate insulating layer 31 may include at least one selected from the group consisting of oxide, nitride, oxynitride, metal silicate, and/or insulating high-k refractory metal oxide (e.g., hafnium oxide or aluminum oxide). For example, the gate insulating layer 31 may include a refractory metal silicon oxide layer or a refractory metal silicon oxynitride layer. In example embodiments, the gate insulating layer 31 may include a hafnium silicon oxide layer or a hafnium metal silicon oxynitride layer.

The first metal silicide layer 53 may be provided on the source and drain regions S/D and the gate G. The first metal silicide layer 53 may include nickel. The first metal silicide layer 53 may further include platinum.

The sidewall spacer 37 may cover a sidewall of the gate G. The sidewall spacer 37 may include a silicon oxide layer and/or a silicon nitride layer.

A portion of the first metal layer 33 of the gate G may extend to the first dent D1. A portion of the first metal layer 33 (especially, on the first dent D1) may have a width greater than the polysilicon layer 35. A width of the gate G and a thickness of the sidewall spacer 37 may be reduced to increase an integration density of the semiconductor device, and in this sense, the sidewall spacer 37 may have a thickness that exposes at least a portion of the first metal layer 33 of the gate G. The sidewall spacer 37 may not cover wholly the portion of the first metal layer 33 that extends to the first dent D1. In example embodiments, a thickness of the polysilicon layer 35 may be greater than that of the first metal layer 33.

The source and drain regions S/D may be portions of the substrate doped with n-type or p-type dopants.

FIGS. 15 through 18 are sectional views illustrating operations of fabricating a semiconductor device according to example embodiments of inventive concepts.

Figure 15:
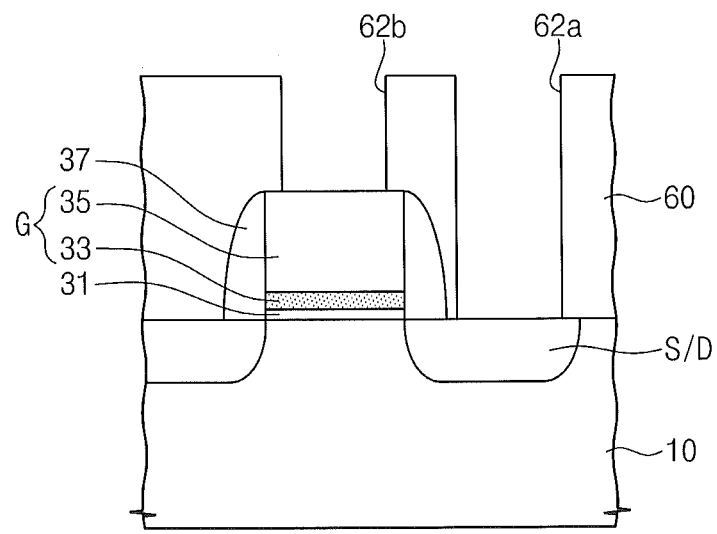
FIGS. 15 through 18 are sectional views illustrating operations of fabricating a semiconductor device according to example embodiments of inventive concepts.

Referring to FIG. 15, the gate insulating layer 31 and the gate G may be provided on the substrate 10. The gate insulating layer 31 and the gate G may be formed using the same method as that of previous embodiments described with reference to FIGS. 2 through 7. The gate insulating layer 31 may include at least one selected from the group consisting of oxide, nitride, oxynitride, metal silicate, and/or an insulating high-k refractory metal oxide (e.g., hafnium oxide, and/or aluminum oxide). For example, the gate insulating layer 31 may include a refractory metal silicon oxide layer and/or a refractory metal silicon oxynitride layer. In example embodiments, the gate insulating layer 31 may include a hafnium silicon oxide layer and/or a hafnium metal silicon oxynitride layer. The gate G may include the first metal layer 33 and the polysilicon layer 35, which are sequentially stacked on the active region 11. The first metal layer 33 may include a metal layer (e.g., of tungsten and/or molybdenum) and/or a conductive metal nitride layer (e.g., of titanium nitride, tungsten nitride, and/or tantalum nitride).

The sidewall spacer 37 may be formed on the sidewall of the gate G. The sidewall spacer 37 may include a silicon oxide layer and/or a silicon nitride layer. The interlayered insulating layer 60 may be formed to cover the gate G. The interlayered insulating layer 60 may be a silicon oxide layer.

The interlayered insulating layer 60 may be patterned to form a second opening 62a exposing at least a portion of the source and drain regions S/D and a third opening 62b exposing the top surface of the gate G. An electrolyzed sulfuric acid may be used to remove a residue in the second and third openings 62a and 62b.

Figure 16:
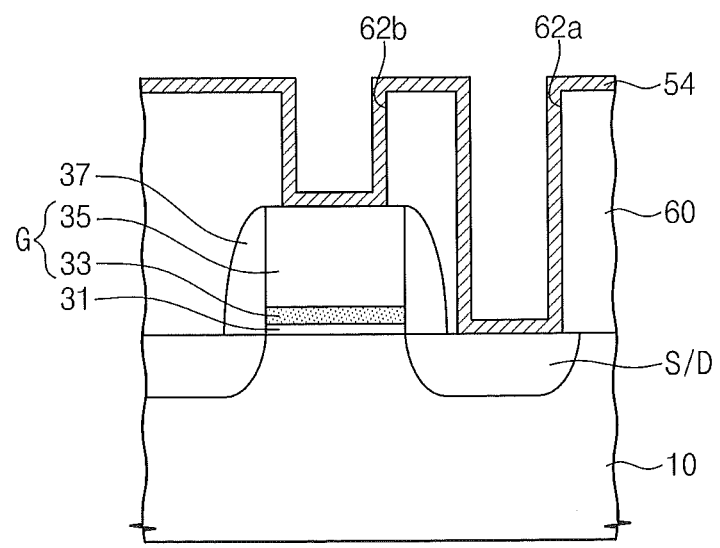

Referring to FIG. 16, a third metal layer 54 may be provided in the second and third openings 62a and 62b. The third metal layer 54 may include nickel. The third metal layer 54 may further include platinum in the range of about 1 wt % to about 15 wt %. The third metal layer 54 may have a thickness of several hundred angstroms. A titanium nitride layer (not shown) may be additionally formed on the third metal layer 54.

Figure 17:
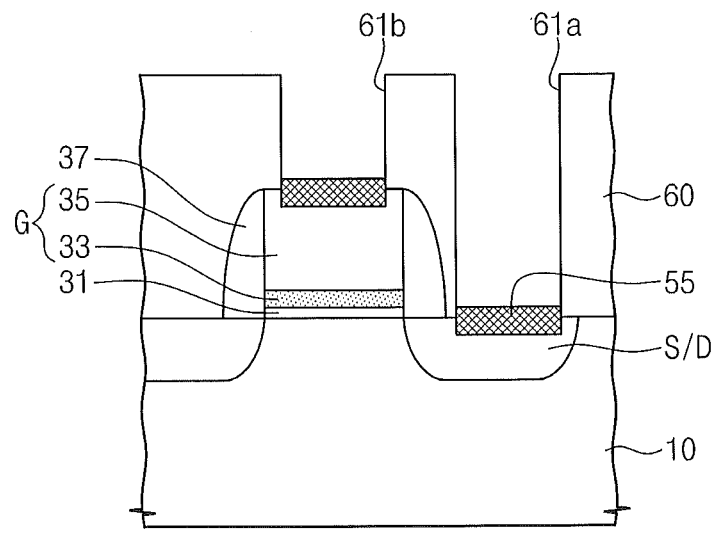

Referring to FIG. 17, the third metal layer 54 may be thermally treated to form a second metal silicide layer 55. The second metal silicide layer 55 may be formed by a reaction between silicon of the substrate 10 and the third metal layer 54 and/or between the polysilicon layer of the gate G and the third metal layer 54. The third metal silicide layer 55 may be formed on the source and drain regions S/D and the gate G. The thermal treatment may include the first and second thermal treatments previously described with reference to FIG. 9. As described above, an unreacted metal residue may remain. The unreacted metal residue may be removed after the first and second thermal treatments. According to example embodiments of inventive concepts, the removal of the unreacted metal residue may be performed using the afore-described electrolyzed sulfuric acid.

Figure 18:
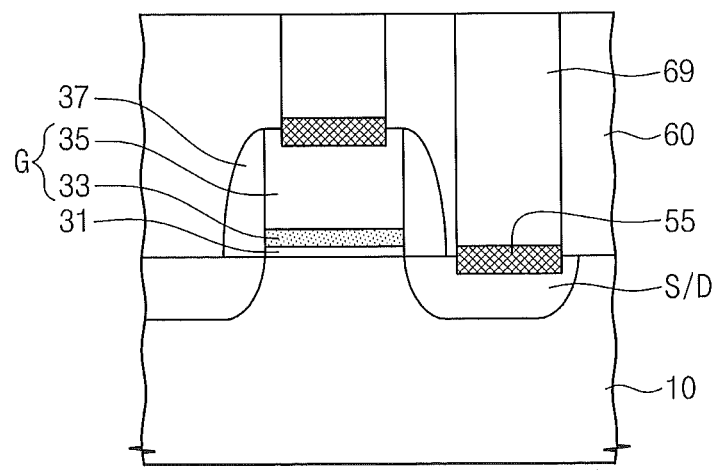

Referring to FIG. 18, contact plugs 69 may be formed in the second and third openings 62A and 62B. In example embodiments, the contact plugs 69 may be formed of tungsten.

Example embodiments of inventive concepts may not be limited to the example in which the third metal silicide layer 55 is formed on only one of the source and drain regions. For example, the third metal silicide layer 55 may be formed on both of the source and drain regions.

FIGS. 19 through 25 are sectional views illustrating a method of fabricating a semiconductor device according to example embodiments of inventive concepts.

Referring to FIGS. 19 through 22, a mold insulating layer 20 may be formed on the substrate 10 to have a gate trench 25 exposing the substrate. The mold insulating layer 20 may be, for example, a silicon oxide layer. The formation of the mold insulating layer 20 having the gate trench 25 will be exemplarily described below.

Figure 19:
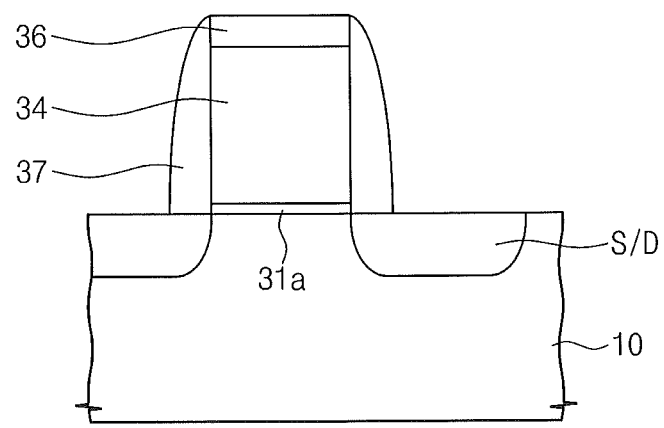
FIGS. 19 through 25 are sectional views illustrating operations of fabricating a semiconductor device according to example embodiments of inventive concepts.

Referring to FIG. 19, a first gate insulating layer 31a, a dummy gate 34, and a hard mask pattern 36 may be sequentially stacked on the substrate 10 described with reference to FIGS. 2 to 4. The first gate insulating layer 31a may be formed of silicon oxide. The dummy gate 34 may be formed of polysilicon. The hard mask pattern 36 may be formed of silicon oxide. The sidewall spacer 37 may be formed on sidewalls of the dummy gate 34 and the hard mask pattern 36. The sidewall spacer 37 may include a silicon oxide layer and/or a silicon nitride layer. The source and drain regions S/D may be formed in the substrate disposed at both sides of the dummy gate 34.

Figure 20:
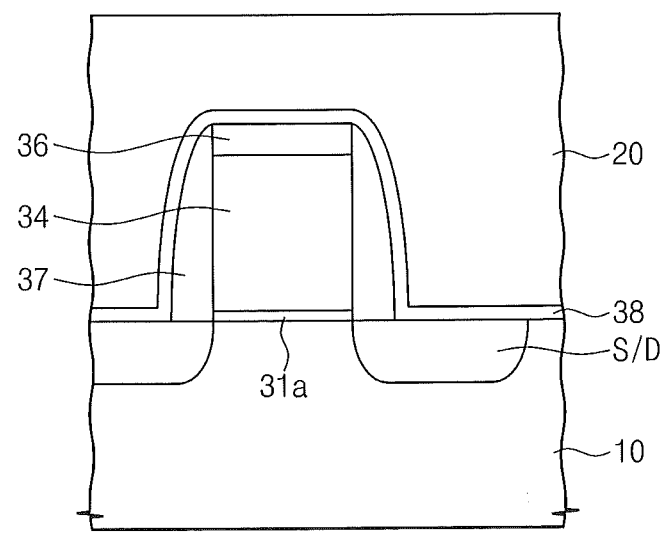

Referring to FIG. 20, a liner layer 38 may be formed to cover the substrate 10, the sidewall spacer 37 and the hard mask pattern 36. The liner layer 38 may be a silicon oxide layer and/or a silicon nitride layer. The mold insulating layer 20 may be formed on the liner layer 38.

Figure 21:
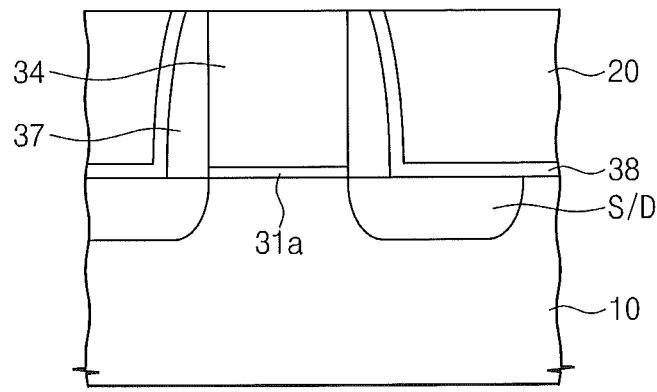
Figure 22:
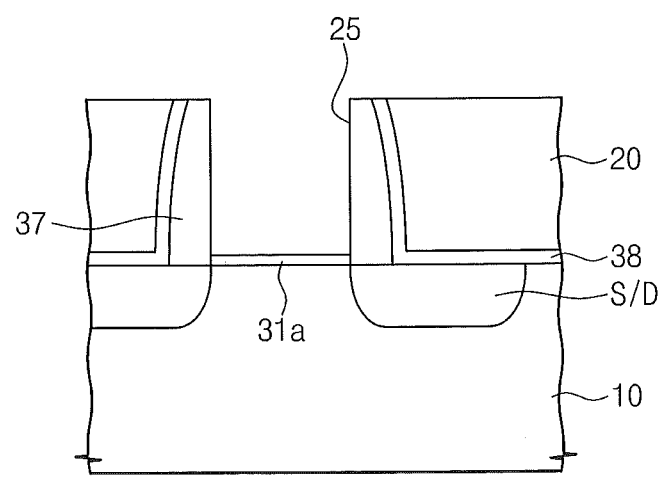

Referring to FIGS. 21 and 22, a planarization process may be performed to expose the dummy gate 34. The hard mask pattern 36 may be removed during the planarization process. In addition, the dummy gate 34 may be selectively removed. As a result, the mold insulating layer 20 may be formed to have the gate trench 25 and the first gate insulating layer 31a may be exposed.

Figure 23:
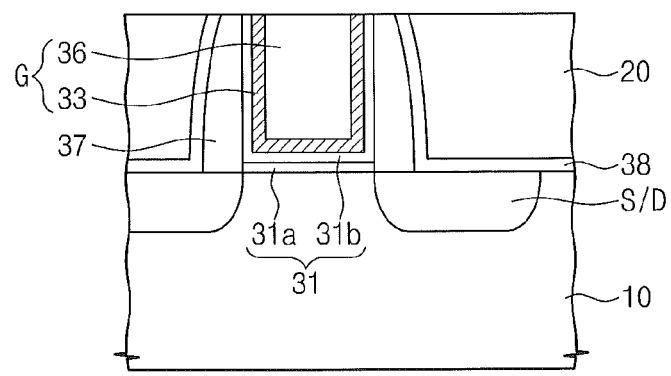

Referring to FIG. 23, a second gate insulating layer 31b may be formed. The second gate insulating layer 31b may include at least one selected from the group consisting of silicon nitride, silicon oxynitride, metal silicate, and/or an insulating high-k refractory metal oxide (e.g., hafnium oxide or aluminum oxide). For example, the second gate insulating layer 31b may include a refractory metal oxide, a refractory metal silicon oxide layer, and/or a refractory metal silicon oxynitride layer. In example embodiments, the second gate insulating layer 31b may include a hafnium oxide layer, a hafnium silicon oxide layer, and/or a hafnium metal silicon oxynitride layer. The first gate insulating layer 31a may be formed by a process other than that described with reference to FIG. 19. For example, the first gate insulating layer 31a may be formed by thermally treating the substrate 10 exposed by the gate trench 25. The gate insulating layer 31 may include the first gate insulating layer 31a and the second gate insulating layer 31b.

The gate G may be formed on the gate insulating layer 31. The formation of the gate G may include depositing a gate material to fill at least a portion of the gate trench 25, and then, planarizing the gate material to expose the mold insulating layer 20. The gate G may include a metal nitride layer 33 and a fourth metal layer 36, which are sequentially stacked. The metal nitride layer 33 may be formed of a titanium nitride layer and/or a tantalum nitride layer. In example embodiments, the fourth metal layer 36 may include, for example, stacked layers of titanium and aluminum.

Figure 24:
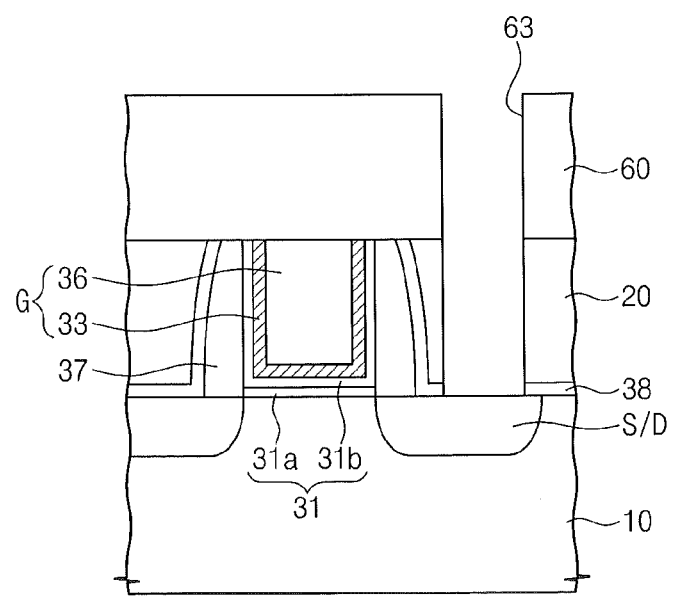

Referring to FIG. 24, the interlayered insulating layer 60 may be formed to cover the gate G. The interlayered insulating layer 60 may be a silicon oxide layer. The interlayered insulating layer 60 may be patterned to form a fourth opening 63 exposing a portion of the substrate 10 at one or both sides of the gate G. Hereinafter, the gate G may be covered with the interlayered insulating layer 60.

Figure 25:
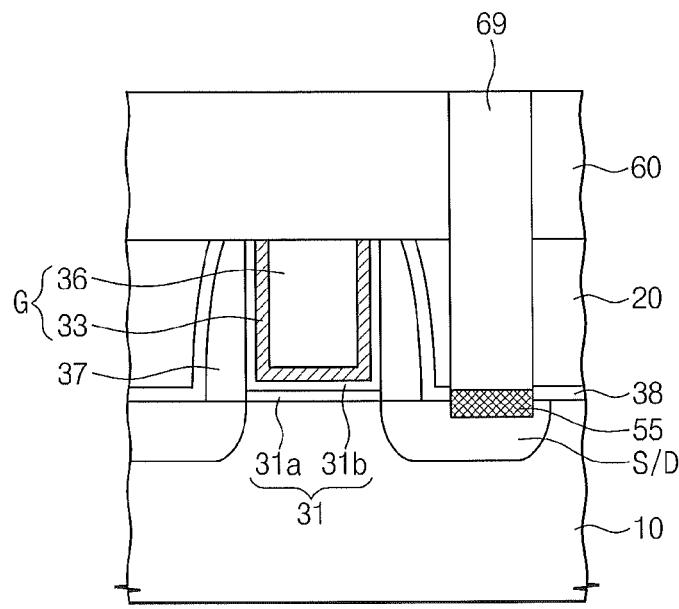

Referring to FIG. 25, similar to the method previously described with reference to FIGS. 16 through 18, the third metal silicide layer 55 may be formed on the substrate 10 exposed by the fourth opening 63. The contact plug 69 may be formed in the third opening 63. The contact plug 69 may be formed of tungsten. Example embodiments of inventive concepts are not limited to the depicted example, in which the third metal silicide layer 55 is formed on one of the source and drain regions. For example, the third metal silicide layer 55 may be formed at both the source and drain regions.

Methods according to example embodiments of inventive concepts may be effective in forming a transistor, whose gate length is on the order of about 20 nm or less.

Figure 26:
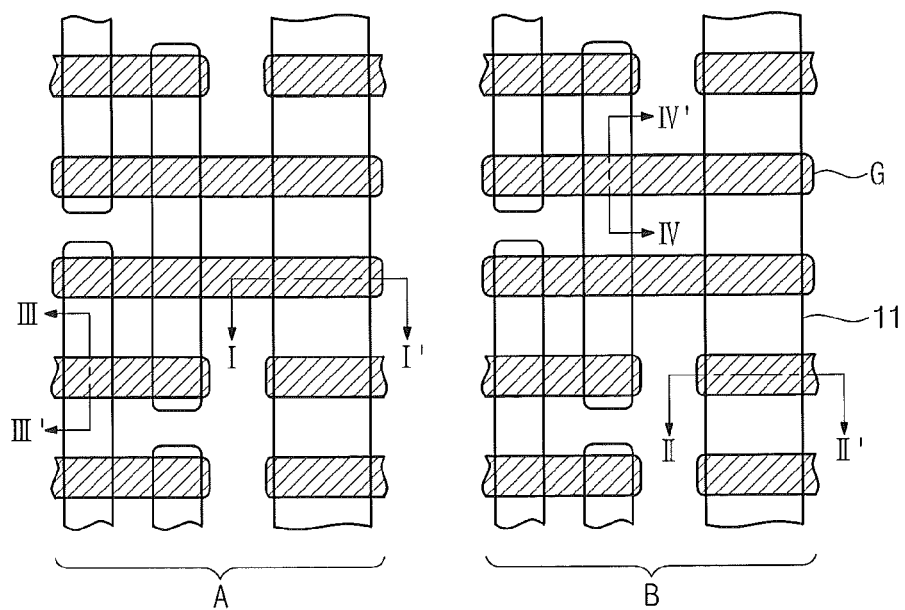
FIG. 26 is a layout illustrating an example of a semiconductor device according to example embodiments of inventive concepts.

FIG. 26 is a layout illustrating an example of a semiconductor device according to example embodiments of inventive concepts.

Referring to FIG. 26, the semiconductor device may include a first region A and a second region B spaced apart from the first region A. The substrate may include an N-well provided in the first region A. The first region A may be, for example, a PMOS region, in which PMOS transistors are formed. The substrate may include a P-well provided in the second region B. The second region B may be, for example, an NMOS region, in which NMOS transistors are formed.

The gate G may be formed to cross the active region 11 of the first and second regions A and B. An interlayered insulating layer (not shown) may be formed to cover the gate G.

FIGS. 27A through 41A illustrate operations of fabricating a semiconductor device according to other example embodiments of inventive concepts and are sectional views taken along lines I-I' and II-II' of FIG. 26. FIGS. 27B through 41B illustrate corresponding sectional views taken along lines III-III' and IV-IV' of FIG. 26. In order to reduce complexity in the drawings and to provide better understanding of inventive concepts, the views illustrated in FIGS. 27B through 38B may differ from or be somewhat exaggerated with respect to the views in FIGS. 27A through 38A, in terms of geometric size and ratio of elements.

Figure 27A:
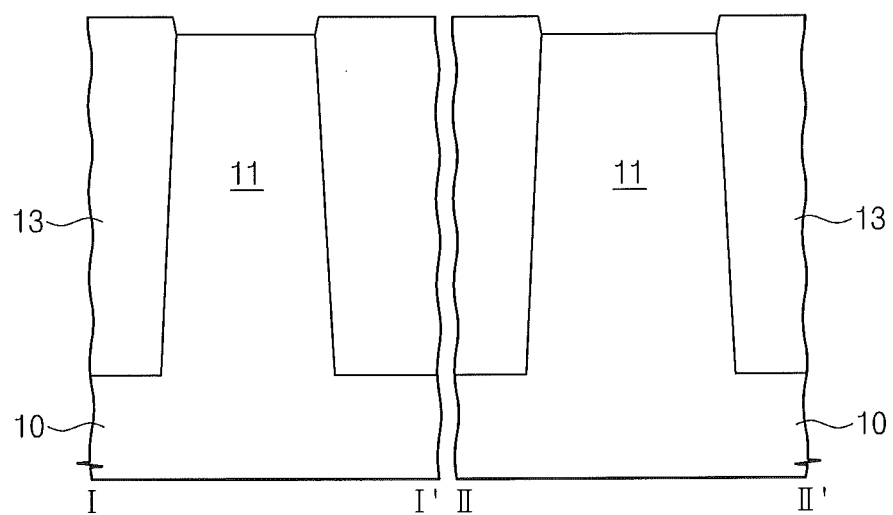
Figure 27B:
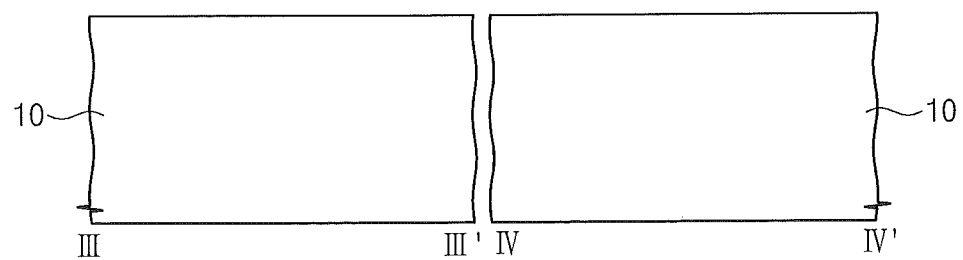

Referring to FIGS. 26, 27A and 27B, the substrate 10 having the first region A and the second region B may be provided. The substrate 10 may be a silicon substrate. The substrate 10 may include a single-crystalline silicon layer or a silicon-on-insulator (SOI) structure. The substrate 10 may have a first conductivity type (e.g., a p-type).

The device isolation layer 13 may be formed on the substrate 10 to define the active region 11. As described with reference to FIG. 2, the formation of the device isolation layer 13 may include forming the trench in the substrate 10 and then filling the trench with an insulating layer. For example, the device isolation layer 13 may be formed using STI processes. In example embodiments, the insulating layer may include a silicon oxide layer, and a liner nitride layer may be formed between the trench and the silicon oxide layer. Before the formation of the liner nitride layer, a thermal oxide layer may be formed on an inner wall of the trench. As described with reference to FIGS. 3 and 4, the first dent (not shown) may be formed at an edge of the device isolation layer 13 adjacent to the active region 11. In example embodiments, the first dent may be formed to have a surface lower than top surfaces of the active region 11 and the device isolation layer 13.

Figure 28A:
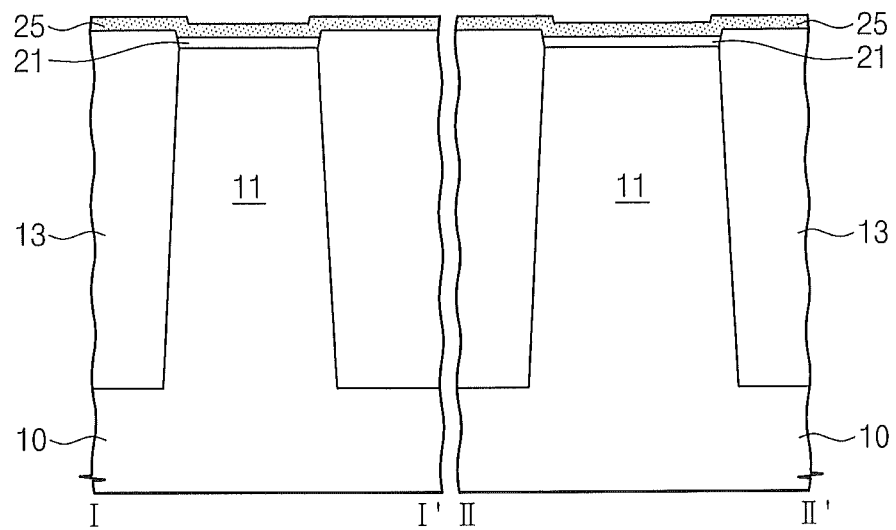
Figure 28B:
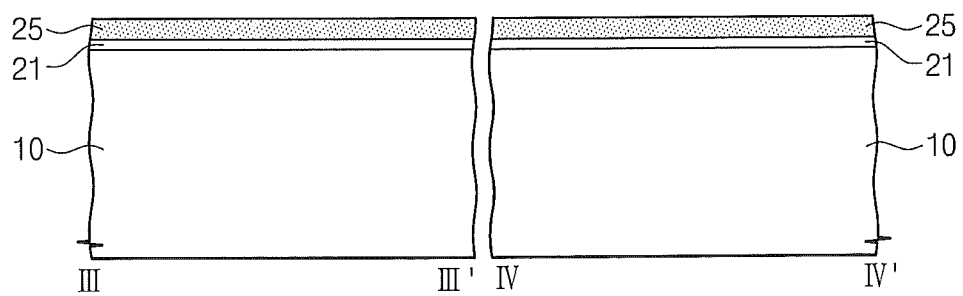

Referring to FIGS. 28A and 28B, the second mask layer 25 may be formed. In example embodiments, the second mask layer 25 may be a silicon nitride layer, which may be formed using a CVD method. The buffer oxide layer 21 may be formed between the second mask layer 25 and the substrate 10. The buffer oxide layer 21 may be, for example, a thermal oxide layer.

Figure 29A:
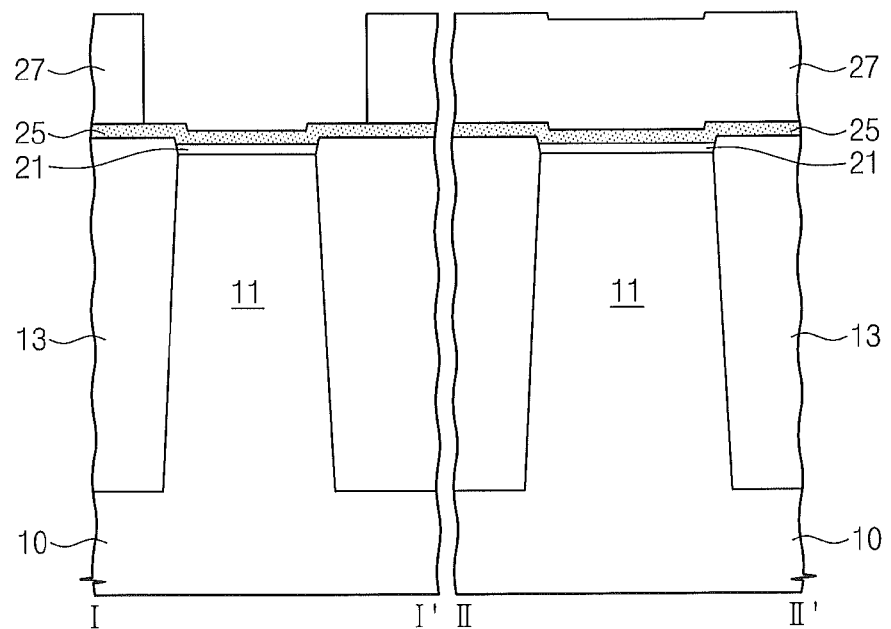
Figure 29B:
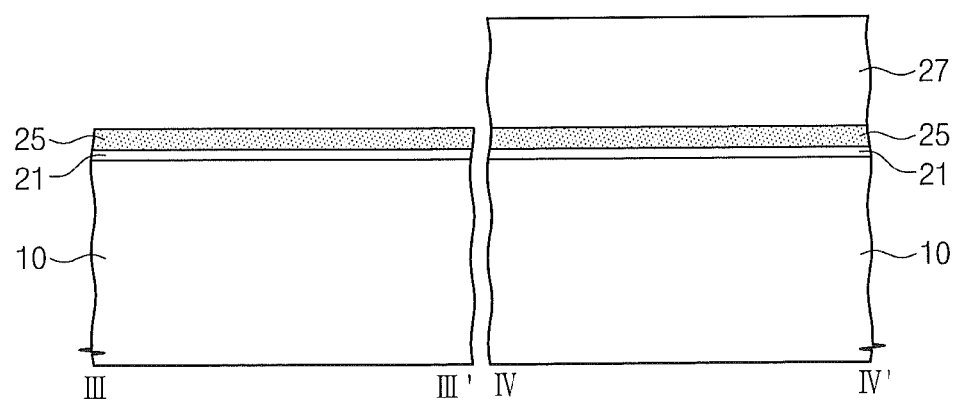
Figure 30A:
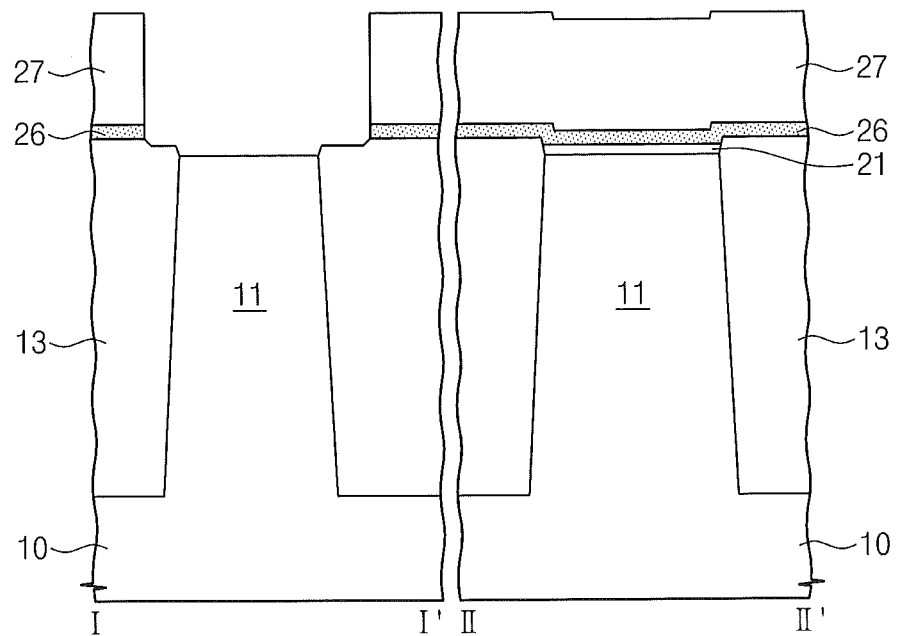
Figure 30B:
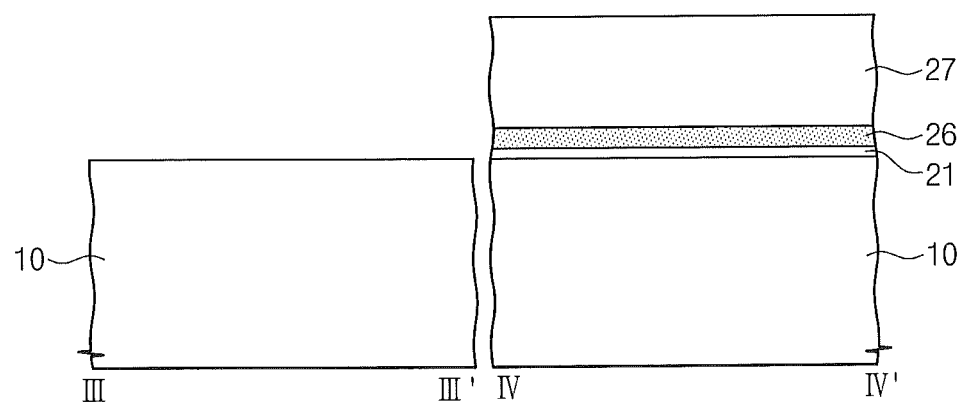
Figure 31A:
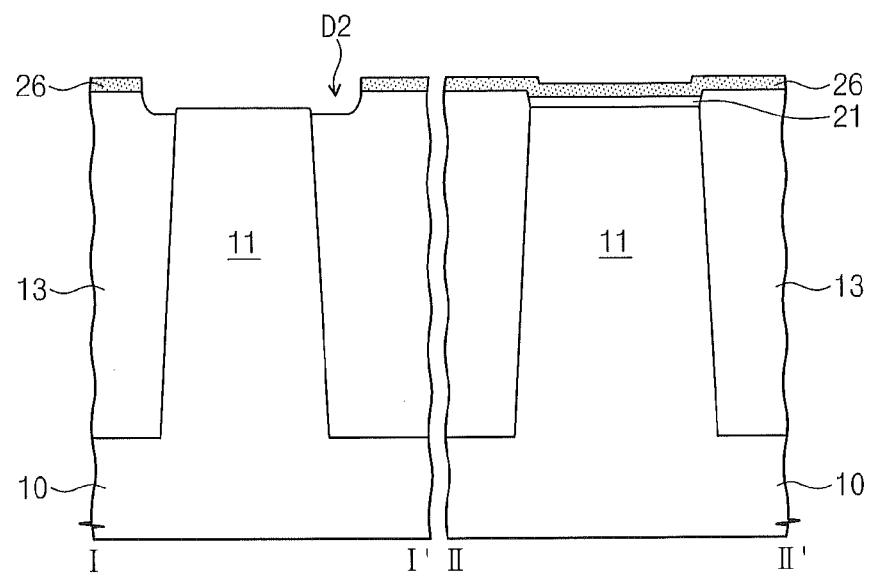
Figure 31B:
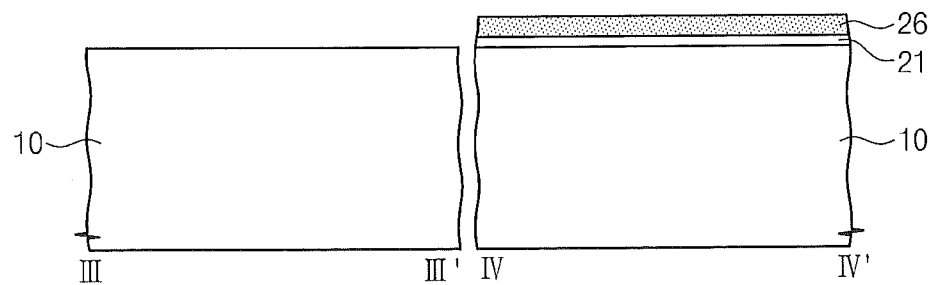

Referring to FIGS. 29A and 29B, a photomask pattern 27 may be formed to expose at least a portion of the first region A. The photomask pattern 27 may cover the second region B. For example, the photomask pattern 27 may be formed to selectively expose a channel region and/or source and drain regions of the first region A. In example embodiments, the photomask pattern 27 may be formed to expose additionally some portion of the device isolation layer 13 adjacent to the active region of the first region A.

Referring to FIGS. 30A, 30B, 31A, and 31B, the second mask layer 25 may be etched using the photomask pattern 27 as an etch mask to form a second mask pattern 26. In example embodiments, the second mask layer 25 may be etched using a dry etching process. Accordingly, the active region of the first region A, which is not covered with the photomask pattern 27, may be exposed. Furthermore, although not depicted, the active region of the exposed first region A may be recessed. In example embodiments, the recess of the active region of the exposed first region A may be performed using an etching process using the second mask pattern 26 as an etch mask.

In example embodiments, during exposing the active region of the first region A, some portion of an edge of the device isolation layer 13 adjacent to the exposed active region of the first region A may be also exposed. Some portion of an edge of the device isolation layer 13 may be etched to form a second dent D2, whose depth is greater than the first dent. The second dent D2 may have a surface lower than that of the exposed active region. In addition, the surface of the second dent D2 may be lower than the top surface of the device isolation layer 13.

Figure 32A:
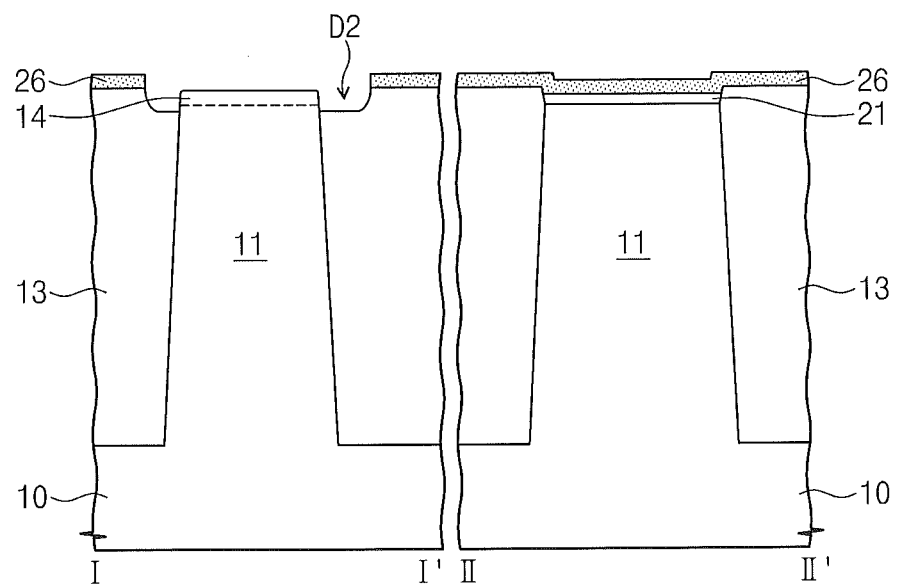
Figure 32B:
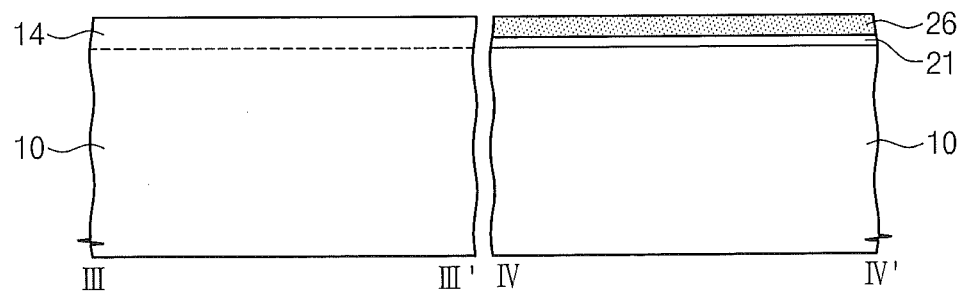

Referring to FIGS. 32A and 32B, a cleaning process may be performed to remove a natural oxide, which may be unintentionally formed on a surface of the exposed active region. For example, the cleaning process may be performed to remove the by-product (e.g., the natural oxide) or impurities from the surface of the active region, and this may enable forming a high quality epitaxial layer on a surface of the active region in a subsequent process. A solution including a hydrofluoric acid may be, for example, used for the cleaning process. This may lead to a further recess of the device isolation layer 13 adjacent to the exposed active region, and thus, the surface of the second dent D2 may be further lowered.

A silicon germanium layer 14 may be selectively formed on the exposed active region. A reaction source for forming the silicon germanium layer 14 may include a silicon source and a germanium source. In example embodiments, the silicon source may include at least one of silane ($SiH_4$), disilane ($Si_2H_6$), dichlorosilane ($SiH_2Cl_2$), trichlorosilane ($SiHCl_3$), and/or silicon tetrachloride ($SiCl_4$), and the germanium source may include germanium tetrahydride ($GeH_4$). The reaction source may further include a dopant source, such as phosphine ($PH_3$), diborane ($B_2H_6$) and/or arsine ($AsH_3$).

In example embodiments, a top surface of the silicon germanium layer 14 may be higher than that of the active region in the second region B.

Figure 33A:
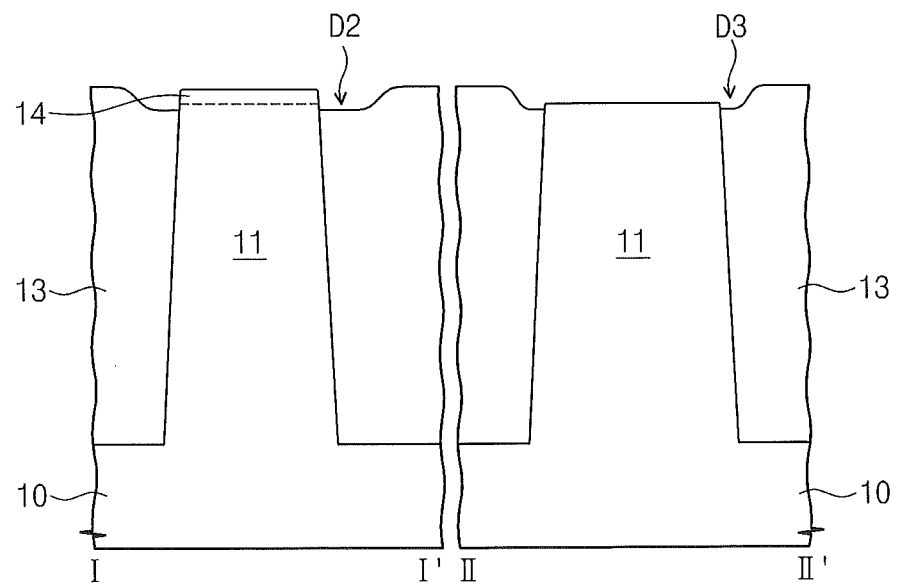
Figure 33B:
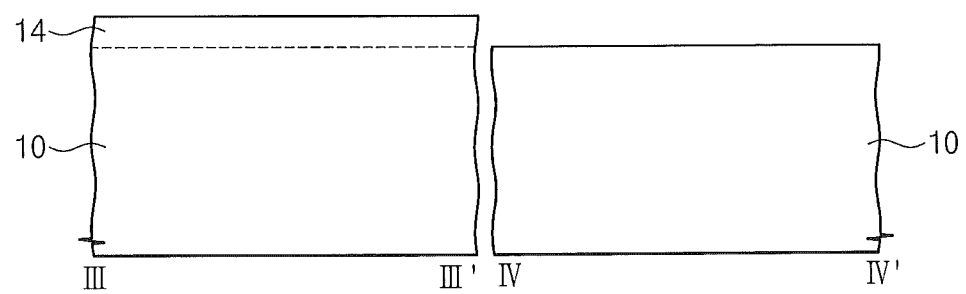

Referring to FIGS. 33A and 33B, the second mask pattern 26 may be removed. The removal of the second mask pattern 26 may be performed using a wet etching process, for example, using a phosphoric acid. In example embodiments, during the removal of the second mask pattern 26, some portion of the edge of the device isolation layer 13, which is positioned adjacent to the exposed active region of the first region A but differs from the second dent D2, may be recessed to form a third dent D3, and at the same time, the second dent D2 may be further lowered to have the surface positioned at a vertical level lower than a surface of the third dent D3. In example embodiments, the surface of the second dent D2 may be lower than a bottom surface of the silicon germanium layer 14. A difference in height between the surface of the second dent D2 and a top surface of the silicon germanium layer 14 may be greater than a difference between the surface of the third dent D3 and the top surface of the active region in the second region B.

Figure 34A:
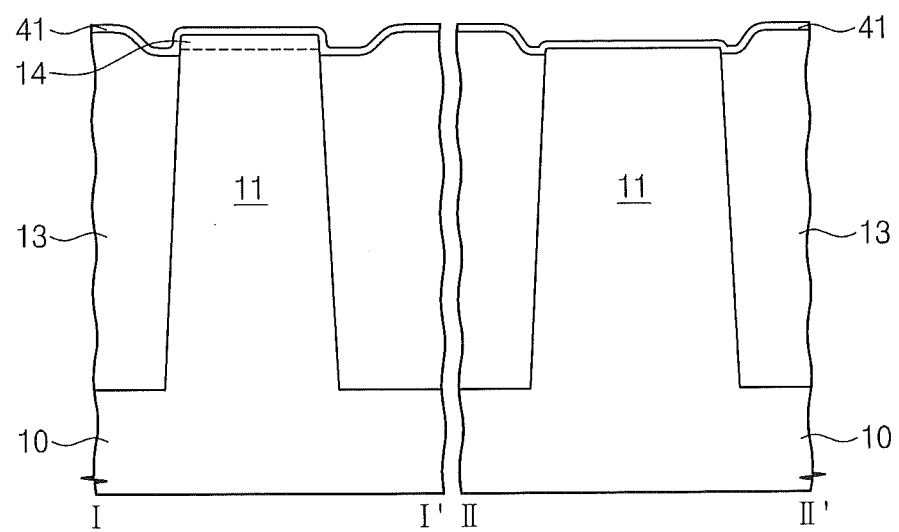
Figure 34B:
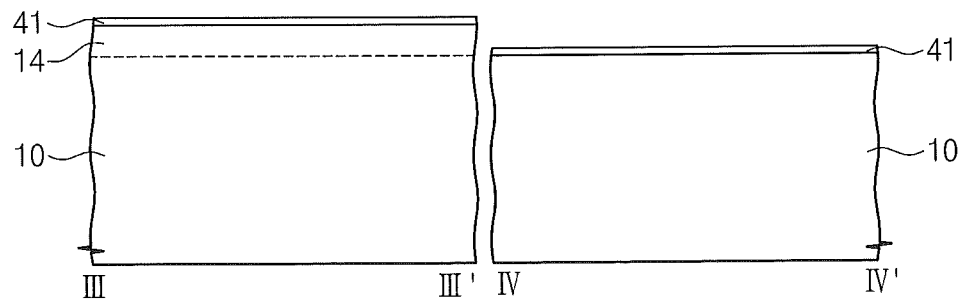

Referring to FIGS. 34A and 34B, a gate insulating layer 41 may be formed. The gate insulating layer 41 may include at least one selected from the group consisting of oxide, nitride, oxynitride, metal silicate, and/or an insulating high-k refractory metal oxide (e.g., hafnium oxide and/or aluminum oxide). For example, the gate insulating layer 41 may include a refractory metal silicon oxide layer and/or a refractory metal silicon oxynitride layer. In example embodiments, the gate insulating layer 41 may include a hafnium silicon oxide layer and/or a hafnium metal silicon oxynitride layer.

Referring to FIGS. 35A, 35B, 36A, and 36B, the gate G may be formed on the gate insulating layer 41. The gate G may include a metal layer. In example embodiments, the gate G may further include a polysilicon layer. The formation of the gate G will be described in greater detail below.

Figure 35A:
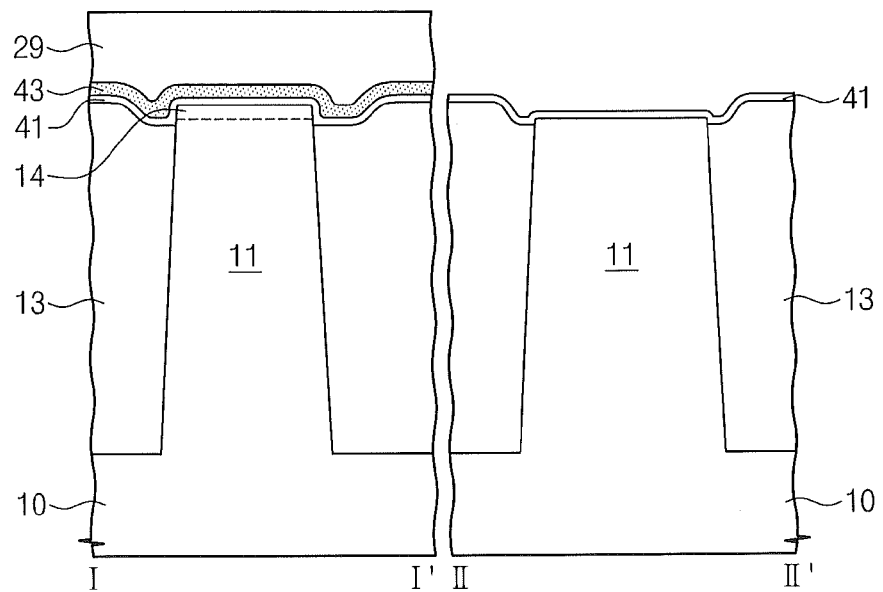
Figure 35B:
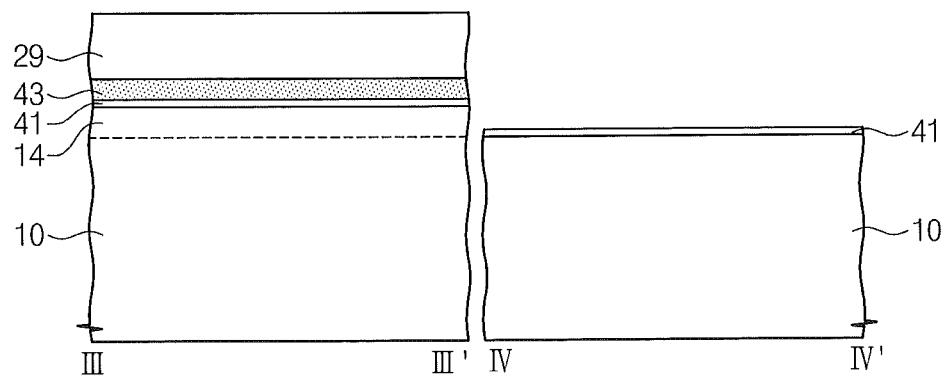

As shown in FIGS. 35A and 35B, a sixth metal layer 43 may be formed on the gate insulating layer 41. The sixth metal layer 43 may include, for example, at least one of tungsten, molybdenum, titanium nitride, tungsten nitride, and/or tantalum nitride. A third mask pattern 29 may be formed on the sixth metal layer 43. The third mask pattern 29 may be a photoresist pattern. The third mask pattern 29 may be formed to expose the sixth metal layer 43 of the second region B. The exposed sixth metal layer 43 may be etched using the third mask pattern 29 as an etch mask. The sixth metal layer 43 may remain locally on the first region A.

Figure 36A:
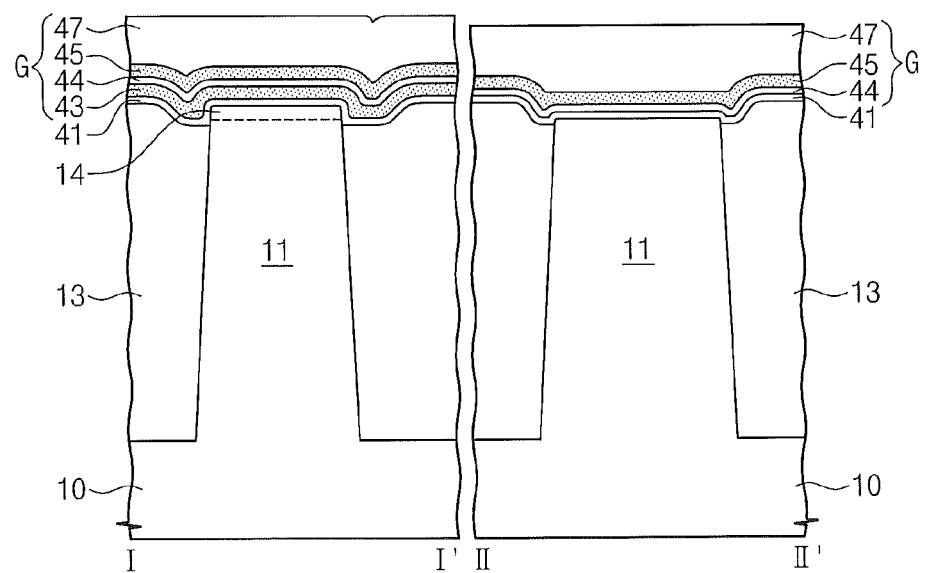
Figure 36B:
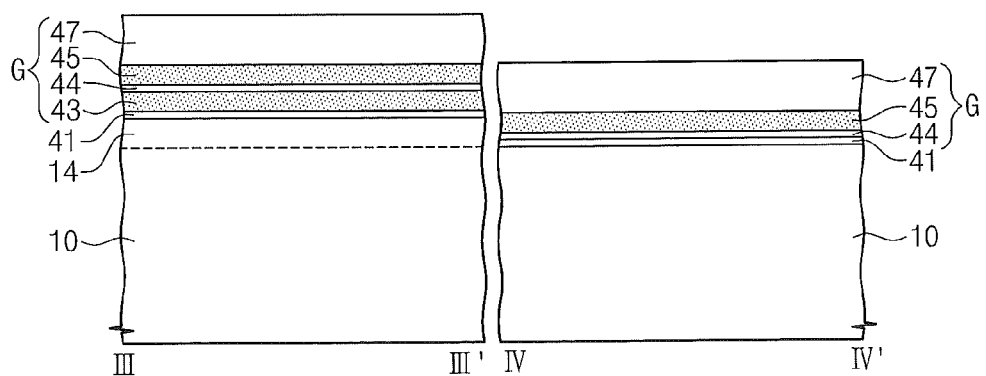

Referring to FIGS. 36A and 36B, the third mask pattern 29 may be removed, and a metal oxide 44 (e.g., of lanthanum oxide) may be formed. The metal oxide 44 may be formed to cover the first metal layer 43 of the first region A and the gate insulating layer 41 of the second region B. A seventh metal layer 45 may be formed on the metal oxide 44. In example embodiments, the seventh metal layer 45 may be formed of the same material as the sixth metal layer 43. A polysilicon layer 47 may be formed on the seventh metal layer 45. The sixth metal layer 43, the metal oxide 44, the seventh metal layer 45, and/or the polysilicon layer 47 may be formed using a sputtering method. The polysilicon layer 47 may be formed to have a thickness greater than a total thickness of the sixth and seventh metal layers.

Figure 37A:
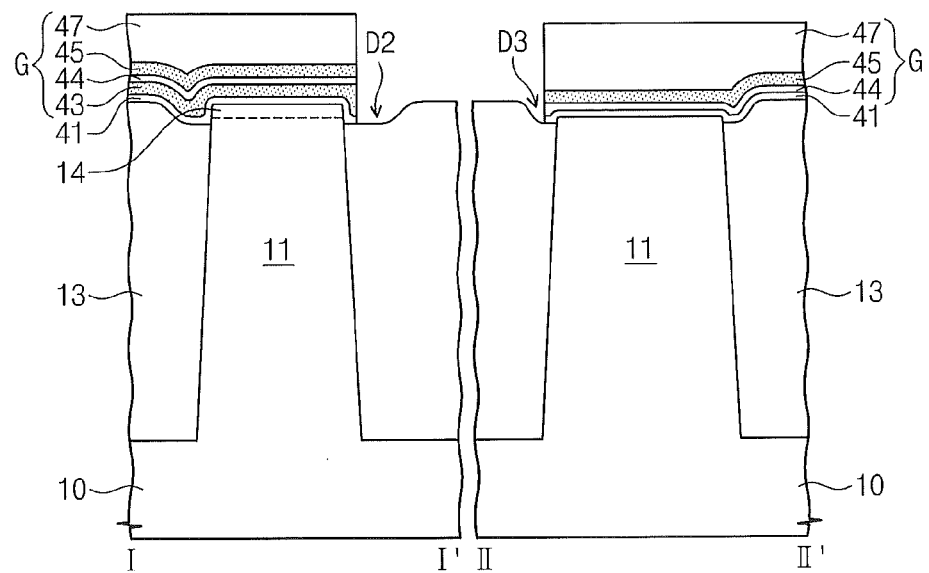
Figure 37B:
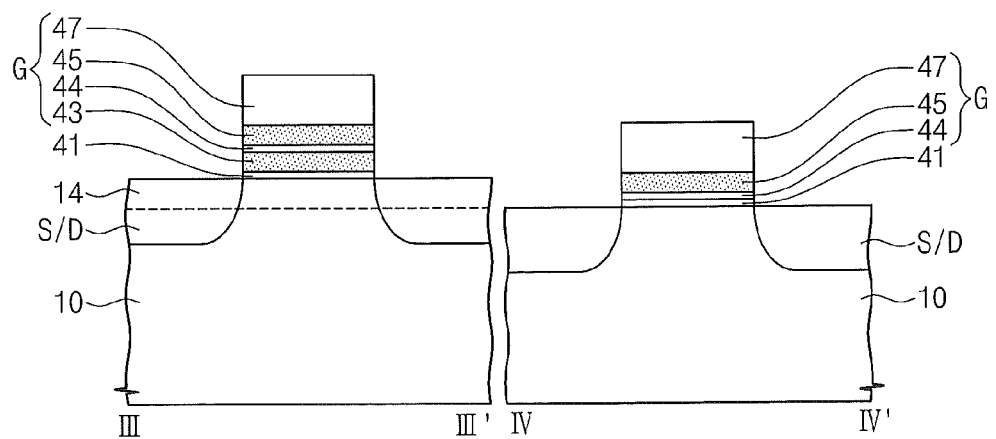

Referring to FIGS. 37A and 37B, the gate G may be patterned. A portion of the patterned gate G may extend toward the second and third dents D2 and D3.

Figure 38A:
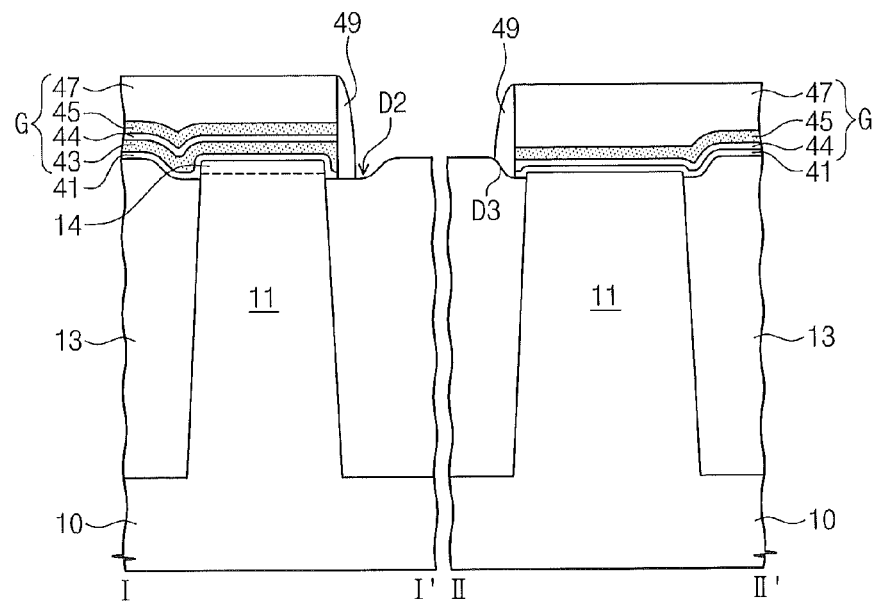
Figure 38B:
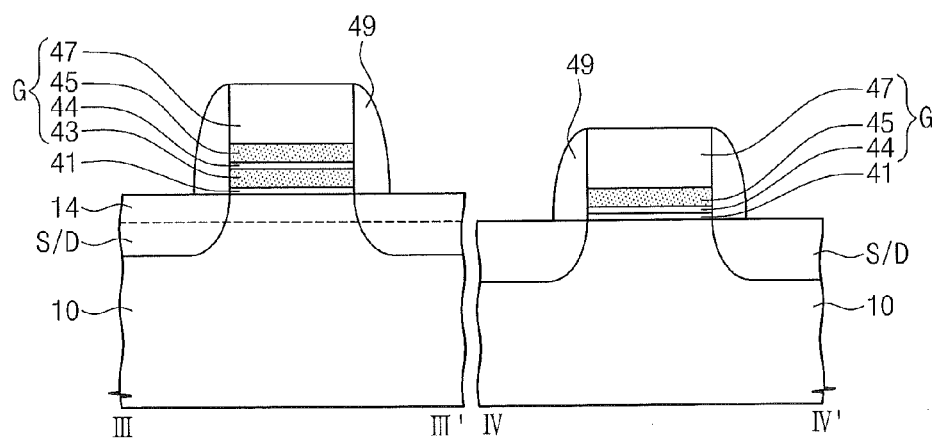

Referring to FIGS. 38A and 38B, the active region 11 may be doped with impurities, by using the gate G as an ion implant mask, to form the source and drain regions S/D. In example embodiments, unlike shown in FIG. 37A, the silicon germanium layer 14 of the source and drain regions S/D may be removed.

A sidewall spacer 49 may be formed on a sidewall of the gate G. The sidewall spacer 49 may include a silicon oxide layer and/or a silicon nitride layer. The sidewall spacer 49 may not fully cover the sidewall of the gate G, because the gate G extends toward the second and third dents D2 and D3.

Figure 39A:
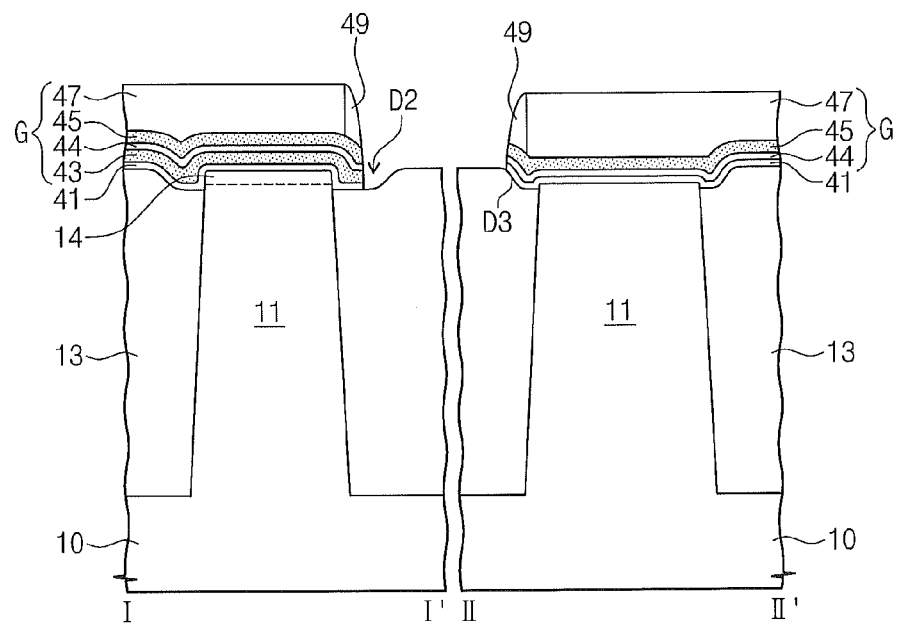
Figure 39B:
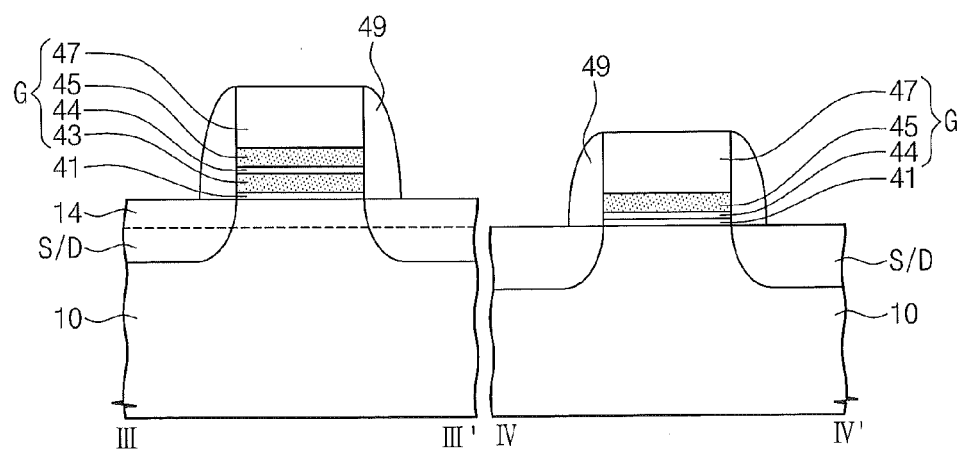

Furthermore, as shown in FIGS. 39A and 39B, the sixth and seventh metal layers 43 and 45 may be formed to have portions, each width of which is greater than that of the polysilicon layer 47 on, for example, the second and third dents D2 and D3. This may be because the polysilicon layer 47 and the sixth and seventh metal layers 43 and 45 are successively etched in the same process. In the case in which the sixth and seventh metal layers 43 and 45 have portions extending toward the second and third dents D2 and D3, thicknesses of the sixth and seventh metal layers 43 and 45 may increase on the second and third dents D2 and D3. As a result, during the patterning of the gate G, it may be hard to remove the sixth and seventh metal layers 43 and 45 from the second and third dents D2 and D3. After the patterning of the gate G, a remaining thickness of the sixth and seventh metal layers 43 and 45 may thus increase on the second and third dents D2 and D3. Furthermore, in the case in which a width of the gate G and a thickness of the sidewall spacer 49 decrease with increased integration density of the semiconductor device, the sidewall spacer 49 may be formed partially exposing the sixth and seventh metal layers 43 and 45 on the second and third dents D2 and D3.

Figure 40A:
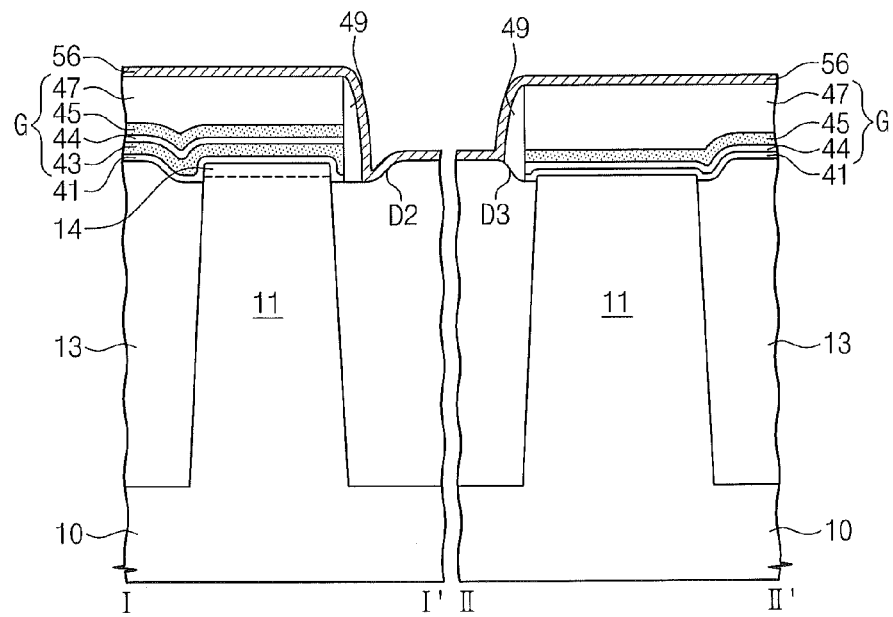
Figure 40B:
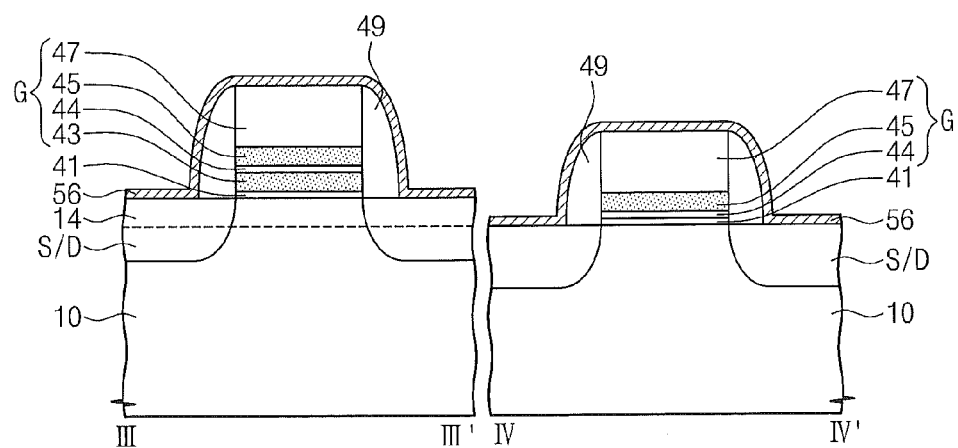

Referring to FIG. 40A and FIG. 40B, an eighth metal layer 56 may be provided on the active region 11 and the gate G. The eighth metal layer 56 may be formed of a nickel-containing material. The eighth metal layer 56 may further include platinum in the range of about 1 wt % to about 15 wt %. The eighth metal layer 56 may have a thickness of several hundred angstroms. In example embodiments, a titanium nitride layer (not shown) may be further formed on the eighth metal layer 56.

Figure 41A:
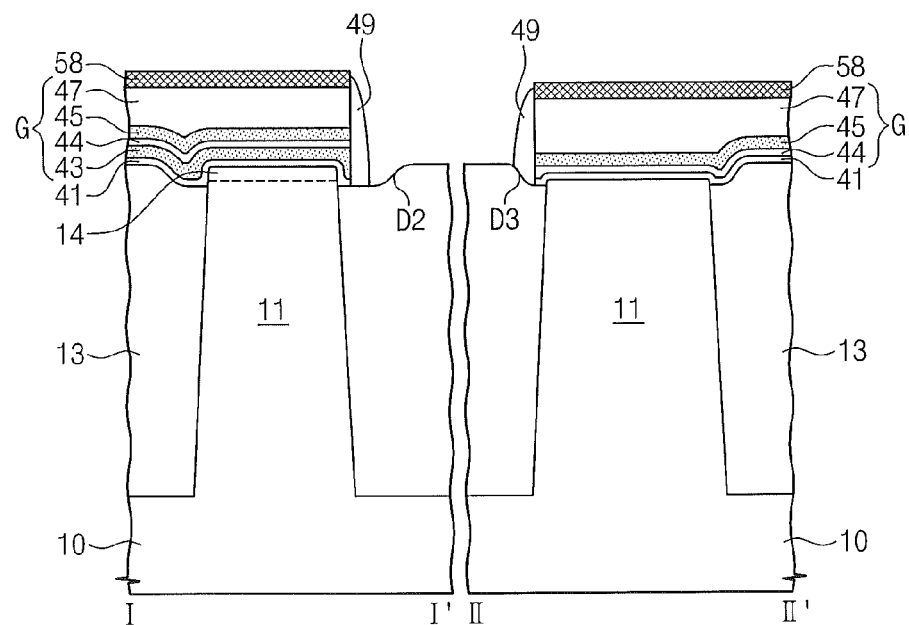
Figure 41B:
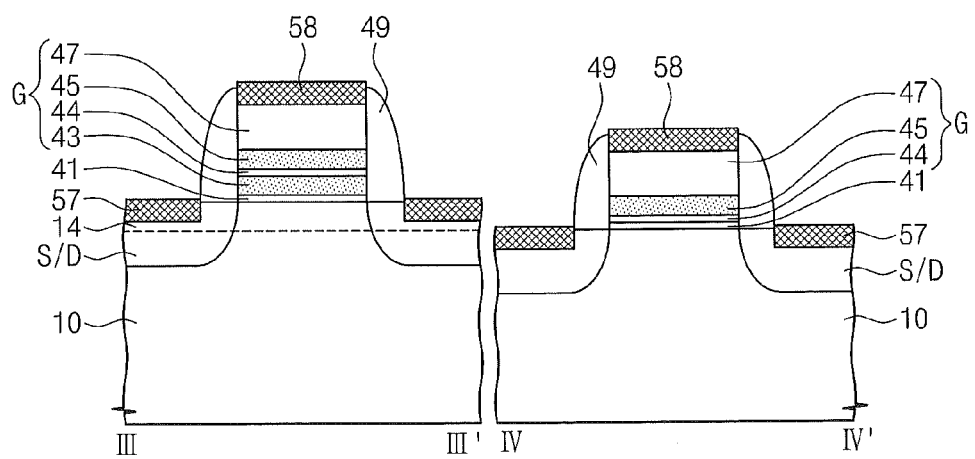

Referring to FIGS. 41A and 41B, the eighth metal layer 56 may be thermally treated to form fourth and fifth metal silicide layers 57 and 58. The fourth and fifth metal silicide layers 57 and 58 may be formed by a reaction between silicon of the substrate 10 and the eighth metal layer 56 or between the polysilicon layer 47 of the gate G and the eighth metal layer 56. The fourth metal silicide layer 57 may be formed on the active region 11 positioned at both sides of the gate G, and the fifth metal silicide layer 58 may be formed on the gate G. The thermal treatment and the removal of unreacted metal residue may be performed using the method previously described with reference to FIGS. 9 and 10.

The electrolyzed sulfuric acid and the SPM may have similar etch rates in the case of the metal layer (e.g., of nickel) provided for the metal silicide layers. By contrast, in case of the metal layer (e.g., tungsten, molybdenum, titanium nitride, tungsten nitride, and/or tantalum nitride) provided for the gate, an etch rate of the electrolyzed sulfuric acid may be much lower than that of the SPM. As a result, as shown in FIG. 39A, the sixth and seventh metal layers 43 and 45 may be maintained even if the sixth and seventh metal layers 43 and 45 are not wholly covered with the sidewall spacer layer 49 and are exposed by the electrolyzed sulfuric acid. By contrast, the conventional SPM may be effective in removing the unreacted metal residue, but the sixth and seventh metal layers 43 and 45 may be unintentionally removed by the conventional SPM.

In other words, according to example embodiments of inventive concepts, if the unreacted metal residue is removed using the electrolyzed sulfuric acid, it is possible to suppress removal of the metal layer of the gate G thereby reducing failures of the semiconductor devices.

Semiconductor devices according to example embodiments of inventive concepts will be described with reference to FIGS. 41A and 41B.

The semiconductor device according to example embodiments of inventive concepts may include the gate G provided on the substrate 10 with the gate insulating layer 41 interposed therebetween, the source and drain regions S/D disposed at both sides of the gate G, and the sidewall spacer 49 disposed on a sidewall of the gate G.

The substrate 10 may include a single-crystalline silicon layer or a silicon-on-insulator (SOI) structure. The substrate 10 may have a first conductivity type (e.g., a p-type). The substrate 10 may include the first region A and the second region B. The substrate 10 may include an N-well provided in the first region A. The first region A may be, for example, a PMOS region, in which PMOS transistors are formed. The substrate 10 may include a P-well provided in the second region B. The second region B may be, for example, an NMOS region, in which NMOS transistors are formed. The device isolation layer 13 may be provided on the substrate 10 to define the active region 11.

In the first region A, there may be a metal-semiconductor compound layer 14 disposed on the active region 11. The metal-semiconductor compound layer 14 may be formed of silicon germanium. For example, a ratio of the number of germanium atoms to the total number of atoms in the metal-semiconductor compound layer 14 may be in a range of about 15% to about 100%. In example embodiments, the metal-semiconductor compound layer 14 may cover wholly the active region 11 of the first region A. Alternatively, the metal-semiconductor compound layer 14 may be locally formed on the channel region of the first region A or on the source and drain regions S/D of the first region A.

The gate G may be provided on the active region 11 to extend toward a top surface of the device isolation layer 13. The gate G may include a metal layer and the polysilicon layer 47, which are sequentially stacked on the active region 11. The metal layer for the gate G may include a layer containing metallic elements, such as tungsten and/or molybdenum, and/or a conductive metal nitride layer (e.g., of titanium nitride, tungsten nitride, and/or tantalum nitride).

A lower portion of the gate G may be formed of a conductive material, whose work-function is in a range selected to realize a desired threshold voltage of a transistor. The gate G on the first region A may include the sixth metal layer 43, the metal oxide 44, the seventh metal layer 45, and the polysilicon layer 47, which are stacked sequentially. The gate G on the second region B may include the metal oxide 44, the seventh metal layer 45, and the polysilicon layer 47. The sixth and seventh metal layers 43 and 45 may include, for example, at least one of tungsten, molybdenum, titanium nitride, tungsten nitride and/or tantalum nitride. In example embodiments, the gate G on the first region A may include a first titanium nitride layer 43, a lanthanum oxide 44, a second titanium nitride layer 45, and the polysilicon layer 47, which are stacked sequentially, and the gate G on the second region B may include the lanthanum oxide 44, the second titanium nitride layer 45, and the polysilicon layer 47, which are stacked sequentially. The lanthanum oxide 44 may be spaced apart from the gate insulating layer 41 in the first region A and be embedded in the titanium nitride layers in the second region B. In the dents D2 and D3, the sixth and seventh metal layers 43 and 45 may have widths greater than the polysilicon layer 47. The polysilicon layer may have a thickness greater than a total thickness of the metal layers.

The gate insulating layer 41 may include at least one selected from the group consisting of oxide, nitride, oxynitride, metal silicate, and/or an insulating high-k refractory metal oxide (e.g., hafnium oxide and/or aluminum oxide). For example, the gate insulating layer 41 may include a refractory metal silicon oxide layer or a refractory metal silicon oxynitride layer. In example embodiments, the gate insulating layer 41 may include a hafnium silicon oxide layer, and/or a hafnium metal silicon oxynitride layer.

The sidewall spacer 49 may cover a sidewall of the gate G. The sidewall spacer 49 may include a silicon oxide layer and/or a silicon nitride layer.

The source and drain regions S/D may be a portion of the substrate doped with n- or p-type dopants. In the first region A, the source and drain regions S/D may be a portion of the substrate doped with p-type dopants. In the second region B, the source and drain regions S/D may be a portion of the substrate doped with n-type dopants.

The fourth and fifth metal silicide layers 57 and 58 may be provided on the source and drain regions S/D and the gate G, respectively. The fourth and fifth metal silicide layers 57 and 58 may be formed of a nickel-containing material. The fourth and fifth metal silicide layers 57 and 58 may further include platinum in the range of about 1 wt % to about 15 wt %.

The device isolation layer 13 may be a shallow trench isolation (STI) layer. The device isolation layer 13 may have the second and third dents D2 and D3 adjacent to the active region 11. The second dent D2 may be a recessed portion of the edge of the device isolation layer 13, which may be positioned in the first region A. The third dent D3 may be another recessed portion of the edge of the device isolation layer 13, which may positioned in the second region B. A surface of the second dent D2 may be lower than that of the third dent D3.

The sixth and seventh metal layers 43 and 45 of the gate G may have portions extending toward the dents D2 and D3. In the case in which a width of the gate G and a thickness of the sidewall spacer 49 decrease with increasing integration density of the semiconductor device, the sidewall spacer 49 may have a thickness capable of exposing at least partially the metal layers of the gate G. For example, at least, the metal layers of the gate G may have portions, which extend toward the dents D2 and D3 but are not wholly covered with the sidewall spacer 49.

In example embodiments, the gate G may have the same structure as that formed by the method previously described with reference to FIGS. 19 through 25, unlike shown in FIGS. 41A and 41B.

Figure 42:
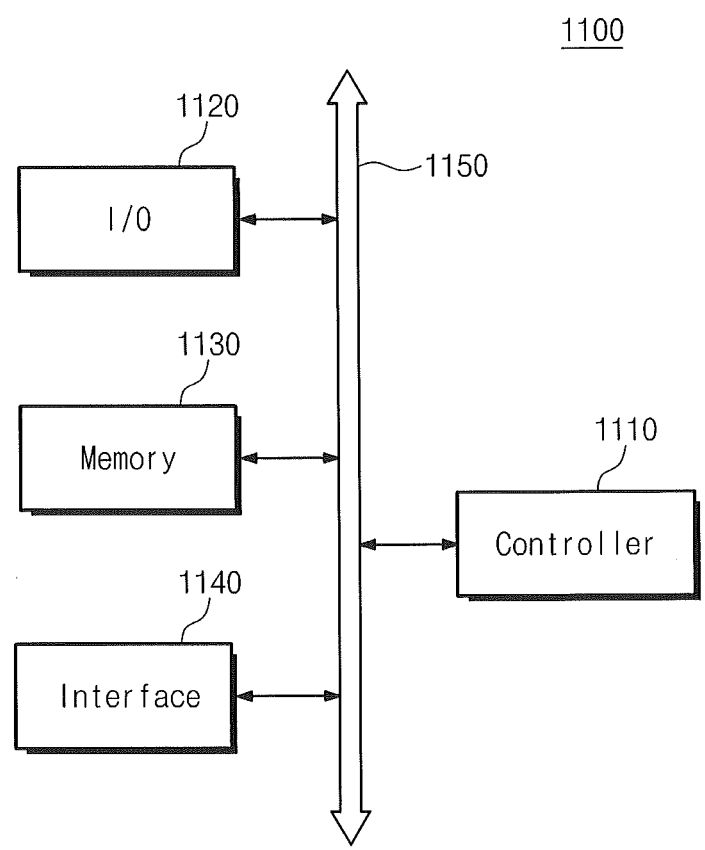
FIG. 42 is a schematic block diagram illustrating an example of electronic systems including semiconductor devices according to example embodiments of inventive concepts.

FIG. 42 is a schematic block diagram illustrating an example of electronic systems including a semiconductor device according to example embodiments of inventive concepts.

Referring to FIG. 42, an electronic system 1100 according to example embodiments of inventive concepts may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller or another logic device. The other logic device may have a similar function to any one of the microprocessor, the digital signal processor and the microcontroller. The I/O unit 1120 may include a keypad, a keyboard or a display unit. The memory device 1130 may store data and/or commands. The memory device 1130 may include at least one of the semiconductor devices according to embodiments described above. The memory device 1130 may further include another type of semiconductor devices which are different from the semiconductor devices described above. The interface unit 1140 may transmit electrical data to a communication network or may receive electrical data from a communication network. The interface unit 1140 may operate wirelessly or using a wired coupling. For example, the interface unit 1140 may include an antenna for wireless communication and/or a transceiver for wired communication. Although not shown in the drawings, the electronic system 1100 may further include a relatively fast DRAM device and/or a fast SRAM device that acts as an operating memory device to improve an operation of the controller 1110.

The electronic system 1100 may be applied to a lap-top computer, a personal digital assistant (PDA), a portable computer, a web tablet, a wireless phone, a mobile phone, a digital music player, a memory card or an electronic product. The electronic product may be configured to receive or transmit information data wirelessly.

Figure 43:
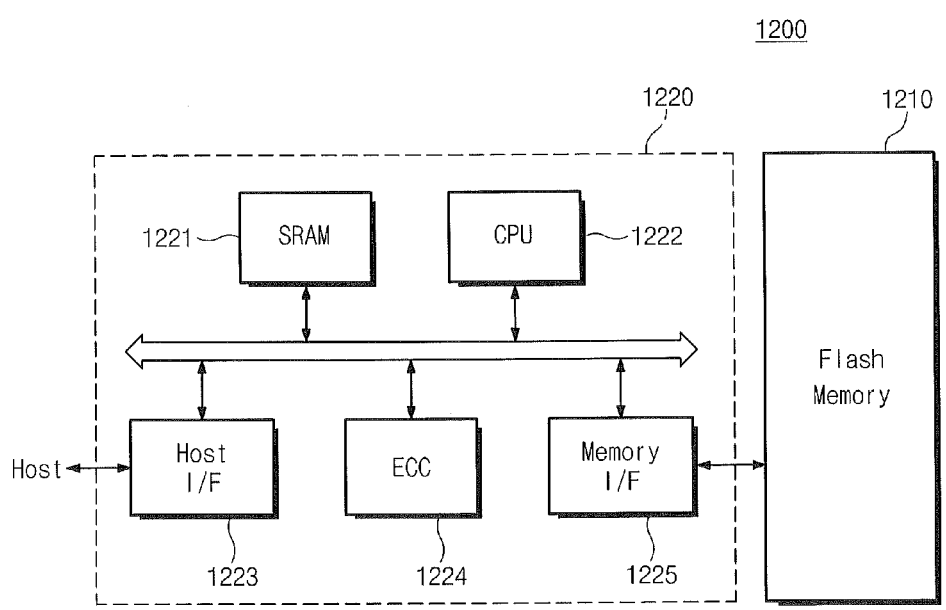
FIG. 43 is a schematic block diagram illustrating an example of memory cards including semiconductor devices according to example embodiments of inventive concepts.

FIG. 43 is a schematic block diagram illustrating an example of memory cards including the semiconductor devices according to example embodiments of inventive concepts.

Referring to FIG. 43, a memory card 1200 may include a memory device 1210. In example embodiments, the memory device 1210 may include at least one of the semiconductor devices according to the various embodiments mentioned above. In other embodiments, the memory device 1210 may further include other types of semiconductor devices which are different from the semiconductor devices according to the embodiments described above. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may replace hard disks of computer systems as solid state disks (SSD) of the computer systems.

Figure 44:
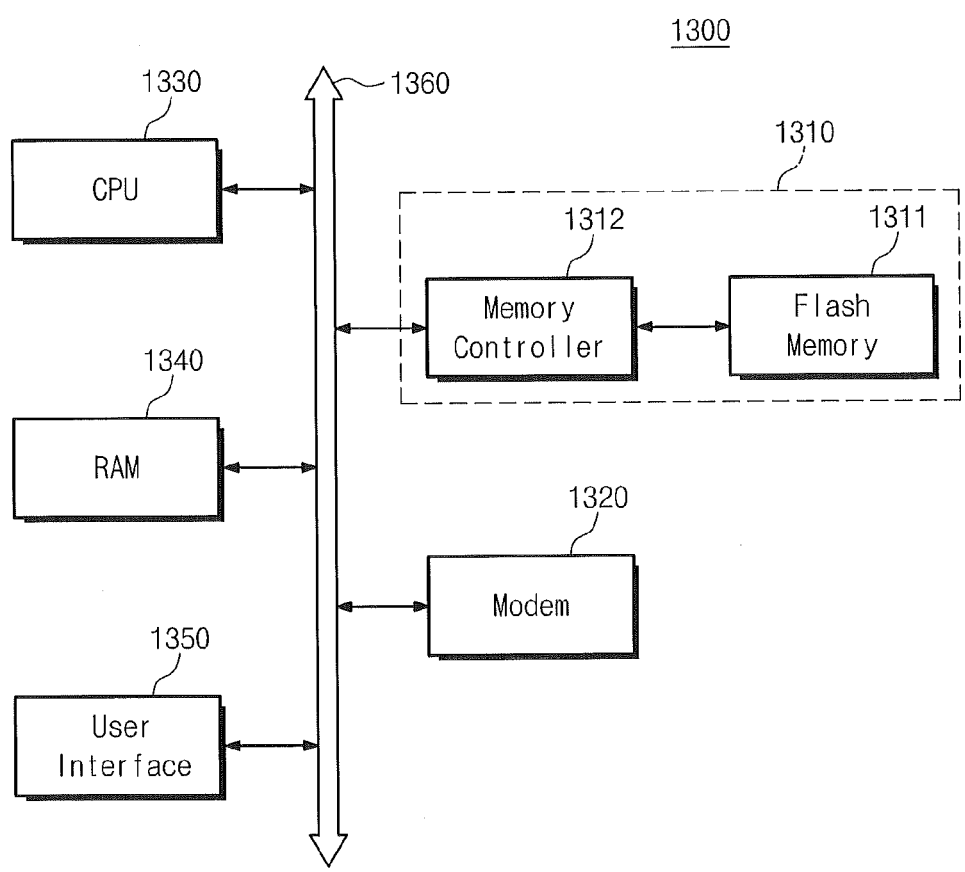
FIG. 44 is a schematic block diagram illustrating an example of information processing systems including a semiconductor device according to example embodiments of inventive concepts.

FIG. 44 is a schematic block diagram illustrating an example of information processing systems including a semiconductor device according to example embodiments of inventive concepts.

Referring to FIG. 44, an information processing system 1300 includes a memory system 1310, which may include at least one of the semiconductor devices according to example embodiments of inventive concepts. The information processing system 1300 also includes a modem 1320, a central processing unit (CPU) 1330, a RAM 1340, and a user interface 1350, which may be electrically connected to the memory system 1310 via a system bus 1360. The memory system 1310 may include a memory device 1311 and a memory controller 1312 controlling an overall operation of the memory device 1311. Data processed by the CPU 1330 and/or input from the outside may be stored in the memory system 1310. Here, the memory system 1310 may be provided as a solid state drive SSD, and thus, the information processing system 1300 may be able to store reliably a large amount of data in the memory system 1310. This increase in reliability enables the memory system 1310 to conserve resources for error correction and realize a high speed data exchange function. Although not shown in the drawing, it will be apparent to those of ordinary skill in the art that the information processing system 1300 may be also configured to include an application chipset, a camera image processor (CIS), and/or an input/output device.

Furthermore, a semiconductor device or memory system according to example embodiments of inventive concepts or may be packaged in various kinds of ways. For example, the semiconductor device or memory system may be employed in a Package on Package (PoP), Ball Grid Array (BGA), Chip Scale Package (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and/or Wafer-level Processed Stack Package (WSP).

According to example embodiments of inventive concepts, an electrolyzed sulfuric acid may be used to remove an unreacted metal residue during forming a metal silicide layer of a metal gate transistor. Under the use of the electrolyzed sulfuric acid, an etch rate of a metal layer provided for the metal gate may be slower than that of the unreacted metal residue. Accordingly, a metal layer provided for the metal gate may not be removed during the removal of the unreacted metal residue. Stated in other words, the metal layer for the gate may remain after the formation of the metal silicide layer. As a result, it may be possible to increase reliability of the semiconductor device including the metal gate transistor.

While example embodiments of inventive concepts have been particularly shown and described, it will be understood by one of ordinary skill in the art that variations in form and detail may be made therein without departing from the spirit and scope of the attached claims.

What is claimed is:

1. A method of forming a semiconductor device comprising:
    forming first and second active regions in a silicon substrate wherein the first and second active regions have opposite conductivity types, and wherein the first and second active regions are surrounded by a device isolation layer;
    forming a first gate on the first active region, wherein the first gate includes a first gate insulating layer on the first active region and a first gate electrode on the first gate insulating layer;
    forming a second gate on the second active region, wherein the second gate includes a second gate insulating layer on the second active region and a second gate electrode on the second gate insulating layer;
    forming first source/drain regions in the first active region on opposite sides of the first gate;
    forming second source/drain regions in the second active region on opposite sides of the second gate;
    forming a metal layer on at least one of the first source/drain regions and on at least one of the second source/drain regions;
    reacting the metal layer with the at least one of the first source/drain regions and with the at least one of the second source/drain regions to form a metal silicide on the at least one of the first source/drain regions and on the at least one of the second source/drain regions; and
    after reacting the metal layer, removing unreacted residue of the metal layer using an electrolyzed sulfuric acid solution;
    wherein the metal layer comprises nickel, and the first gate electrode comprises at least one of tungsten, molybdenum, titanium nitride, tungsten nitride, and/or tantanlum nitride.

2. The method of claim 1 wherein the first gate electrode comprises a metal oxide layer on the gate insulating layer, and a metal nitride layer on the metal oxide layer.

3. The method of claim 2 wherein the metal oxide layer is a first metal oxide layer, wherein the metal nitride layer is a first metal nitride layer, wherein the second gate electrode comprises a second metal nitride layer on the second gate insulating layer, a second metal oxide layer on the second metal nitride layer, and a third metal nitride layer on the second metal oxide layer.

4. The method of claim 3 wherein the first gate is substantially free of nitride between the first metal oxide layer and the first gate insulating layer.

5. The method of claim 1 further comprising:
before forming the first and second gates, selectively forming a semiconductor layer including germanium on the second active region while maintaining the first active region substantially free of the semiconductor layer including germanium.

6. The method of claim 1 further comprising:
before forming the metal layer, forming an insulating spacer on a sidewall of the second gate, wherein a portion of the second gate electrode extends between the insulating spacer and the device isolation layer.

7. The method of claim 1 wherein a volume of sulfuric acid in the electrolyzed sulfuric acid solution is in the range of about 70% to about 95% of the total volume of the electrolyzed sulfuric acid solution, wherein a concentration of oxidant in the electrolyzed acid solution is in the range of about 7 g/L to about 25 g/L, and wherein a temperature of the electrolyzed sulfuric acid solution is in the range of about 130 degrees C. to about 180 degrees C.

8. The method of claim 1 wherein reacting the metal layer comprises performing a first thermal treatment, the method further comprising:
after removing the unreacted residue, performing a second thermal treatment at a temperature exceeding a maximum temperature of the first thermal treatment.

9. The method of claim 8 further comprising:
after performing the second thermal treatment, cleaning a surface of the semiconductor device including the metal silicide using aqua regia.

10. A method of forming a semiconductor device, the method comprising:
forming a gate on a silicon substrate, wherein the gate includes a gate insulating layer on the silicon substrate and a gate electrode on the gate insulating layer, and wherein the gate electrode includes a layer of a first metal on the gate insulating layer;
forming source/drain regions in the silicon substrate on opposite sides of the gate;
forming a second metal layer on at least one of the source/drain regions, wherein the first and second metal layers comprise different metals;
reacting the second metal layer with the at least one of the source/drain regions to form a metal silicide on the at least one of the source/drain regions; and
after reacting the metal layer, removing unreacted residue of the second metal layer using an etching solution wherein an etch rate of the second metal layer with respect to the etching solution is significantly greater than an etch rate of the first metal layer with respect to the etching solution,
wherein the first metal layer comprises at least one of tungsten, molybdenum, titanium nitride, tungsten nitride, and/or tantalum nitride, and
wherein the second metal layer comprises nickel.

11. The method of claim 10 wherein the etching solution comprises an electrolyzed sulfuric acid.

12. A method of forming a semiconductor device, the method comprising:
forming a gate on a substrate, wherein the gate includes a high-k dielectric layer on the substrate and a metal gate electrode on the high-k dielectric layer wherein the metal gate electrode includes a metal nitride layer adjacent the high-k dielectric layer;
forming source/drain regions on the substrate on opposite sides of the gate;
forming sidewall spacers on sidewalls of the gate;
after forming the sidewall spacers, forming a metal layer on at least one of the source/drain regions wherein the metal layer includes nickel, and wherein a portion of the metal nitride layer is exposed between at least one of the sidewall spacers and the substrate before forming the metal layer;
reacting the metal layer with the at least one of the source/drain regions to form a metal silicide on the at least one of the source/drain regions wherein the metal silicide includes nickel silicide; and
after reacting the metal layer, removing unreacted residue of the metal layer using electrolyzed sulfuric acid solution, wherein an etch rate of the unreacted residue of the metal layer in the electrolyzed sulfuric acid solution is significantly greater than an etch rate of the metal nitride layer in the electrolyzed sulfuric acid solution.

13. The method of claim 12 wherein the gate electrode further comprises a polysilicon layer on the metal nitride layer, and wherein a width of the metal nitride layer is greater than a width of the polysilicon layer.

14. The method of claim 12 wherein the metal nitride layer comprises a titanium nitride layer and/or a tantalum nitride layer.

15. The method of claim 12 wherein the high-k dielectric layer comprises at least one of a metal oxide, a metal silicon oxide layer, and/or a metal silicon oxynitride layer.

16. The method of claim 15 wherein the high-k dielectric layer comprises at least one of a hafnium oxide layer, a hafnium silicon oxide layer, and/or a hafnium metal silicon oxynitride layer.

17. The method of claim 12 wherein using the electrolyzed sulfuric acid solution comprises preparing the electrolyzed sulfuric acid solution using hydrogen separation.

18. The method of claim 12 wherein using the electrolyzed sulfuric acid solution comprises using the electrolyzed sulfuric acid solution without significant hydrogen peroxide.

19. The method of claim 12 further comprising:
forming a dummy gate on the substrate;
forming a mold insulating layer on substrate wherein the mold insulating layer surrounds the dummy gate;
removing the dummy gate while maintaining the mold insulating layer thereby defining a trench in the mold layer, wherein forming the gate comprises forming the metal gate electrode in the trench through the mold layer; and
forming an opening through the mold insulating layer wherein the opening exposes a portion of the at least one of the source/drain regions, wherein forming the metal layer comprises forming the metal layer on the mold insulating layer, in the opening, and on the portion of the at least one of the source/drain regions exposed by the opening through the mold insulating layer.

20. The method of claim 19 wherein forming the metal gate electrode comprises forming a metal nitride layer on sidewalls of the trench and on a surface of the trench between the sidewalls of the trench, and forming a gate metal layer on the metal nitride layer in the trench.

21. The method of claim 20 wherein the metal nitride layer comprises at least one of a titanium nitride layer and/or a tantalum nitride layer, and wherein the gate metal layer comprises a titanium layer and/or an aluminum layer on the metal nitride layer.

22. The method of claim 19 wherein the opening through the mold insulating layer is spaced apart from the gate electrode.

23. The method of claim 19 wherein the metal gate electrode comprises a metal nitride layer and a polysilicon layer on the metal nitride layer, and wherein the metal layer comprises nickel.

24. The method of claim 12 wherein a volume of sulfuric acid in the electrolyzed sulfuric acid solution is in the range of about 70% to about 95% of the total volume of the electrolyzed sulfuric acid solution, wherein a concentration of oxidant in the electrolyzed acid solution is in the range of about 7 g/L to about 25 g/L, and wherein a temperature of the electrolyzed sulfuric acid solution is in the range of about 130 degrees C. to about 180 degrees C.

25. A method of forming a semiconductor device, the method comprising:
   forming a gate on a substrate, wherein the gate includes a high-k dielectric layer on the substrate and a metal gate electrode on the high-k dielectric layer;
   forming sourcing/drain regions on the substrate on opposite sides of the gate;
   forming an interlayer insulating layer on the gate and on the source/drain regions;
   forming an opening through the interlayer insulating layer wherein the opening exposes a portion of the at least one of the source/drain regions;
   after forming the interlayer insulating layer and after forming the opening through the interlayer insulating layer, forming a metal layer on at least one of the source/drain regions wherein forming the metal layer comprises forming the metal layer on the interlayer insulating layer, in the opening through the insulating layer, and on the portion of the at least one of the source/drain regions exposed through the opening through the interlayer insulating layer;
   reacting the metal layer with the at least one of the source/drain regions to form a metal silicide on the at least one of the source/drain regions; and
   after reacting the metal layer, removing unreacted residue of the metal layer using electrolyzed sulfuric acid solution.

26. The method of claim 25 wherein the metal gate electrode comprises a metal nitride layer and a polysilicon layer on the metal nitride layer, wherein the metal layer comprises nickel, and wherein the opening is a first opening, the method further comprising:
   before forming the metal layer, forming a second opening through the interlayer insulating layer wherein the second opening exposes a portion of the polysilicon layer,
   wherein forming the metal layer comprises forming the metal layer in the second opening and on the portion of the polysilicon layer exposed by the second opening through the interlayer insulating layer, and
   wherein reacting the metal layer further comprises reacting the metal layer with the portion of the polysilicon layer to form a metal silicide layer on the portion of the polysilicon layer.

27. A method of forming a semiconductor device, the method comprising:
   forming a gate on a substrate, wherein the gate includes a high-k dielectric layer on the substrate and a metal gate electrode on the high-k dielectric layer;
   forming source/drain regions on the substrate on opposite sides of the gate;
   forming a metal layer on at least one of the source/drain regions;
   reacting the metal layer with the at least one of the source/drain regions to form a metal silicide on the at least one of the source/drain regions, wherein reacting the metal layer comprises performing a first thermal treatment;
   after reacting the metal layer, removing unreacted residue of the metal layer using electrolyzed sulfuric acid solution; and
   after removing the unreacted residue, performing a second thermal treatment at a temperature exceeding a maximum temperature of the first thermal treatment.

28. The method of claim 27 further comprising:
   after performing the second thermal treatment, cleaning a surface of the semiconductor device including the metal silicide using aqua regia.

29. The method of claim 28 further comprising:
   before forming the metal layer, forming insulating spacers on sidewalls of the gate;
   after cleaning the surface of the semiconductor device using aqua regia, removing the insulating spacers; and
   after removing the insulating spacers, further cleaning a surface of the semiconductor device including the metal silicide using electrolyzed sulfuric acid solution.

30. A method of forming a semiconductor device, the method comprising:
   forming a gate on a silicon substrate;
   forming source/drain regions in the silicon substrate on opposite sides of the gate;
   forming a metal layer on at least one of the source/drain regions;
   performing a first thermal treatment to form a metal silicide on the at least one of the source/drain regions;
   after reacting the metal layer, removing unreacted residue of the metal layer using electrolyzed sulfuric acid solution;
   after removing unreacted residue, performing a second thermal treatment at a temperature exceeding a maximum temperature of the first thermal treatment; and
   after performing the second thermal treatment, cleaning a surface of the semiconductor device including the metal silicide using aqua regia.

31. The method of claim 30 wherein the metal layer includes nickel and wherein the metal silicide includes nickel silicide.

32. The method of claim 31 further comprising:
   before forming the metal layer, forming sidewall spacers on sidewalls of the gate,
   wherein the gate includes a gate insulating layer on the silicon substrate and a gate electrode on the gate insulating layer, wherein the gate electrode includes a metal nitride layer adjacent the gate insulating layer, wherein a portion of the metal nitride layer is exposed between at least one of the sidewall spacers and the silicon substrate before forming the metal layer, and wherein an etch rate of the unreacted residue of the metal layer in the electrolyzed sulfuric acid solution is significantly greater than an etch rate of the metal nitride layer in the electrolyzed sulfuric acid solution.

33. The method of claim 32 wherein the gate electrode further comprises a polysilicon layer on the metal nitride layer, and wherein a width of the metal nitride layer is greater than a width of the polysilicon layer.

34. The method of claim 32 wherein the metal nitride layer comprises a titanium nitride layer and/or a tantalum nitride layer.

35. The method of claim 30 wherein the gate includes a gate insulating layer on the silicon substrate and a gate electrode on the gate insulating layer, and wherein the gate insulating layer comprises at least one of a metal oxide, a metal silicon oxide layer, and/or a metal silicon oxynitride layer.

36. The method of claim 35 wherein the gate insulating layer comprises at least one of a hafnium oxide layer, a hafnium silicon oxide layer, and/or a hafnium metal silicon oxynitride layer.

37. The method of claim 30 further comprising:
before forming the metal layer, forming an interlayer insulating layer on the gate and on the source/drain regions; and
before forming the metal layer, forming an opening through the interlayer insulating layer wherein the opening exposes a portion of the at least one of the source/drain regions;
wherein forming the metal layer comprises forming the metal layer on the interlayer insulating layer, in the opening through the insulating layer, and on the portion of the at least one of the source/drain regions exposed through the opening through the interlayer insulating layer.

38. The method of claim 37 wherein the gate includes a gate insulating layer on the silicon substrate and a gate electrode on the gate insulating layer, wherein the gate electrode comprises a metal nitride layer on the gate insulating layer and a polysilicon layer on the metal nitride layer, wherein the metal layer comprises nickel, and wherein the opening is a first opening, the method further comprising:
before forming the metal layer, forming a second opening through the interlayer insulating layer wherein the second opening exposes a portion of the polysilicon layer,
wherein forming the metal layer comprises forming the metal layer in the second opening and on the portion of the polysilicon layer exposed by the second opening through the interlayer insulating layer, and
wherein reacting the metal layer further comprises reacting the metal layer with the portion of the polysilicon layer to form a metal silicide layer on the portion of the polysilicon layer.

39. The method of claim 30 wherein using the electrolyzed sulfuric acid solution comprises preparing the electrolyzed sulfuric acid solution using hydrogen separation.

40. The method of claim 30 wherein using the electrolyzed sulfuric acid solution comprises using the electrolyzed sulfuric acid solution without significant hydrogen peroxide.

41. The method of claim 30 further comprising:
forming a dummy gate on the silicon substrate;
forming a mold insulating layer on silicon substrate wherein the mold insulating layer surrounds the dummy gate; and
removing the dummy gate while maintaining the mold insulating layer thereby defining a trench in the mold layer, wherein forming the gate comprises forming a gate electrode in the trench through the mold layer; and
forming an opening through the mold insulating layer wherein the opening exposes a portion of the at least one of the source/drain regions, wherein forming the metal layer comprises forming the metal layer on the mold insulating layer, in the opening, and on the portion of the at least one of the source/drain regions exposed by the opening through the mold insulating layer.

42. The method of claim 41 wherein forming the gate electrode comprises forming a metal nitride layer on sidewalls of the trench and on a surface of the trench between the sidewalls of the trench, and forming a gate metal layer on the metal nitride layer in the trench.

43. The method of claim 42 wherein the metal nitride layer comprises at least one of a titanium nitride layer and/or a tantalum nitride layer, and wherein the gate metal layer comprises a titanium layer and/or an aluminum layer on the metal nitride layer.

44. The method of claim 41 wherein the opening through the mold insulating layer is spaced apart from the gate electrode.

45. The method of claim 41 wherein the gate electrode comprises a metal nitride layer and a polysilicon layer on the metal nitride layer, and wherein the metal layer comprises nickel.

46. The method of claim 30 wherein performing the second thermal treatment comprises performing the second thermal treatment using a laser thermal treatment and/or a halogen lamp.

47. The method of claim 30 wherein a volume of sulfuric acid in the electrolyzed sulfuric acid solution is in the range of about 70% to about 95% of the total volume of the electrolyzed sulfuric acid solution, wherein a concentration of oxidant in the electrolyzed acid solution is in the range of about 7 g/L to about 25 g/L, and wherein a temperature of the electrolyzed sulfuric acid solution is in the range of about 130 degrees C. to about 180 degrees C.

48. A method of forming a semiconductor device, the method comprising:
forming a metal layer on a silicon portion of a substrate;
reacting the metal layer with the silicon portion to form a metal silicide wherein reacting the metal layer comprises performing a first thermal treatment;
after reacting the metal layer, removing unreacted residue of the metal layer using electrolyzed sulfuric acid solution, wherein a volume of sulfuric acid in the electrolyzed sulfuric acid solution is in the range of about 70% to about 95% of the total volume of the electrolyzed sulfuric acid solution, wherein a concentration of oxidant in the electrolyzed acid solution is in the range of about 7 g/L to about 25 g/L, and wherein a temperature of the electrolyzed sulfuric acid solution is in the range of about 130 degrees C. to about 180 degrees C.; and
after removing the unreated residue, performing a second thermal treatment at a temperature exceeding a maximum temperature of the first thermal treatment.

49. The method of claim 48 wherein the metal layer includes nickel and wherein the metal silicide includes nickel silicide.

50. The method of claim 48 wherein using the electrolyzed sulfuric acid solution comprises preparing the electrolyzed sulfuric acid solution using hydrogen separation.

51. The method of claim 48 wherein using the electrolyzed sulfuric acid solution comprises using the electrolyzed sulfuric acid solution without significant hydrogen peroxide.

52. The method of claim 48 further comprising:
after performing the second thermal treatment, cleaning a surface of the semiconductor device including the metal silicide using aqua regia.

53. The method of claim 48 wherein performing the second thermal treatment comprises performing the second thermal treatment using a laser thermal treatment and/or a halogen lamp.

* * * * *